United States Patent
Gessner et al.

(10) Patent No.: US 10,403,840 B2
(45) Date of Patent: Sep. 3, 2019

(54) DEVICES FOR EMITTING AND/OR RECEIVING ELECTROMAGNETIC RADIATION, AND METHOD FOR PROVIDING SAME

(71) Applicants: Fraunhofer-Gesellschaft zur Foerderung der angewandten Forschung e.V., Munich (DE); Technische Universitaet Chemnitz, Chemnitz (DE)

(72) Inventors: Thomas Gessner, Chemnitz (DE); Thomas Otto, Taura (DE); Stefan Schulz, Chemnitz (DE); Sascha Hermann, Chemnitz (DE); Thomas Blaudeck, Chemnitz (DE); Christian Spudat, Chemnitz (DE)

(73) Assignees: Technische Universitaet Chemnitz, Chemnitz (DE); Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 475 days.

(21) Appl. No.: 15/137,288

(22) Filed: Apr. 25, 2016

(65) Prior Publication Data
US 2016/0240806 A1    Aug. 18, 2016

Related U.S. Application Data

(63) Continuation of application No. PCT/EP2014/072735, filed on Oct. 23, 2014.

(30) Foreign Application Priority Data

Oct. 25, 2013  (DE) .................. 10 2013 221 758
Oct. 23, 2014  (WO) .............. PCT/EP2014/072735

(51) Int. Cl.
*H01L 51/50*    (2006.01)
*H01L 51/42*    (2006.01)
(Continued)

(52) U.S. Cl.
CPC ............ *H01L 51/502* (2013.01); *B82Y 10/00* (2013.01); *B82Y 20/00* (2013.01); *H01L 25/046* (2013.01);
(Continued)

(58) Field of Classification Search
CPC ... H01L 51/502; H01L 51/56; H01L 51/0048; H01L 29/413; H01L 29/0673;
(Continued)

(56) References Cited

U.S. PATENT DOCUMENTS 6,153,895 A * 11/2000 Watanabe ........... H01L 31/0322
                                                                257/101
8,373,157 B2   2/2013 Choi et al.
(Continued)

FOREIGN PATENT DOCUMENTS

DE    10 2008 015 118    9/2009
DE    10 2008 035 559    2/2010
(Continued)

OTHER PUBLICATIONS

E. Uccelli et al.: "InAs Quantum Dot Arrays Decorating the Facets of GaAs Nanowires", ACS Nano 4, pp. 5985-5993 (2010).
(Continued)

*Primary Examiner* — Michele Fan
(74) *Attorney, Agent, or Firm* — Dicke, Billig & Czaja, PLLC

(57) ABSTRACT

The invention describes a device for emitting or detecting electromagnetic radiation. The device has a first and a second electrode which are connected to each other via an electrically conductive nanostructure. The electrically con-
(Continued)

ductive nanostructure is configured to receive electrons and holes from the first and second electrode or transport same to the first and second electrode. In addition, the device has a radiation molecule arranged at a circumferential surface of the electrically conductive nanostructure. The radiation molecule is configured to absorb electrons and holes or electromagnetic radiation and emit the electromagnetic radiation with recombination of electrons absorbed and holes absorbed, or emit electrons and holes based on the electromagnetic radiation absorbed. The electrically conductive nanostructure is, in the region of a circumferential surface, surrounded at least partly by the first or second electrode at an end arranged at the first or second electrode in order to provide electrical contact of the first or second electrode and the electrically conductive nanostructure.

10 Claims, 13 Drawing Sheets

(51) Int. Cl.
```
B82Y 10/00      (2011.01)
B82Y 20/00      (2011.01)
H01L 29/423     (2006.01)
H01L 29/775     (2006.01)
H01L 51/00      (2006.01)
H01L 29/12      (2006.01)
H01L 29/06      (2006.01)
H01L 29/41      (2006.01)
H01L 33/16      (2010.01)
H01L 33/34      (2010.01)
H01L 25/04      (2014.01)
H01L 51/44      (2006.01)
H01L 51/56      (2006.01)
H01L 33/38      (2010.01)
H01L 51/52      (2006.01)
```
(52) U.S. Cl.
CPC ........ *H01L 29/0673* (2013.01); *H01L 29/127* (2013.01); *H01L 29/413* (2013.01); *H01L 29/42316* (2013.01); *H01L 29/775* (2013.01); *H01L 33/16* (2013.01); *H01L 33/34* (2013.01); *H01L 51/0048* (2013.01); *H01L 51/447* (2013.01); *H01L 51/56* (2013.01); *H01L 33/38* (2013.01); *H01L 51/428* (2013.01); *H01L 51/5296* (2013.01)

(58) Field of Classification Search
CPC ............... H01L 33/38; H01L 31/02002; H01L 31/035218; H01L 31/035227; H01L 51/42
See application file for complete search history.

(56) References Cited

U.S. PATENT DOCUMENTS

| | | | |
|---|---|---|---|
| 8,976,507 B2* | 3/2015 | Aria | B82Y 10/00 361/502 |
| 2003/0071246 A1* | 4/2003 | Grigorov | C08F 8/44 252/500 |
| 2005/0045867 A1 | 3/2005 | Ozkan et al. | |
| 2008/0017845 A1 | 1/2008 | Drndic et al. | |
| 2008/0066802 A1* | 3/2008 | Reddy | B82Y 10/00 136/258 |
| 2008/0110494 A1* | 5/2008 | Reddy | H01L 31/035272 136/255 |
| 2008/0178924 A1* | 7/2008 | Kempa | B82Y 10/00 136/244 |
| 2008/0192786 A1* | 8/2008 | Bakkers | H01L 33/0004 372/44.01 |
| 2008/0202581 A1* | 8/2008 | Kempa | B82Y 10/00 136/252 |
| 2008/0246020 A1* | 10/2008 | Kawashima | B82Y 10/00 257/24 |
| 2008/0264479 A1* | 10/2008 | Harris | H01L 51/422 136/255 |
| 2008/0272366 A1 | 11/2008 | Moon et al. | |
| 2008/0280115 A1* | 11/2008 | Liang | B82Y 30/00 428/212 |
| 2008/0296538 A1 | 12/2008 | Wu et al. | |
| 2009/0179192 A1* | 7/2009 | Kamins | B82Y 10/00 257/14 |
| 2009/0205713 A1* | 8/2009 | Mitra | B82Y 10/00 136/263 |
| 2010/0012921 A1* | 1/2010 | Kawashima | B82Y 10/00 257/13 |
| 2010/0133471 A1 | 3/2010 | Newkome et al. | |
| 2010/0132771 A1* | 6/2010 | Lu | B82Y 10/00 136/252 |
| 2010/0243020 A1* | 9/2010 | Norton | B82Y 20/00 136/244 |
| 2011/0136288 A1* | 6/2011 | Duane | H01L 21/02381 438/59 |
| 2011/0203632 A1* | 8/2011 | Sen | B82Y 10/00 136/244 |
| 2011/0256451 A1* | 10/2011 | Cui | B32B 5/26 429/218.1 |
| 2011/0297846 A1 | 12/2011 | Wang | |
| 2012/0097232 A1* | 4/2012 | Kim | H01L 31/035281 136/255 |
| 2012/0132888 A1* | 5/2012 | Kwak | B82Y 30/00 257/13 |
| 2012/0197364 A1* | 8/2012 | Banin | A61N 1/0543 607/115 |
| 2012/0207938 A1* | 8/2012 | Chen | B82Y 40/00 427/475 |
| 2013/0042911 A1* | 2/2013 | Jung | H01G 9/2031 136/256 |
| 2013/0240348 A1* | 9/2013 | Mi | H01L 31/03044 204/157.5 |
| 2013/0327385 A1* | 12/2013 | Kim | H01L 31/0749 136/255 |
| 2015/0097193 A1* | 4/2015 | Yap | H01L 29/775 257/76 |
| 2015/0303332 A1* | 10/2015 | Chang | B82Y 30/00 136/256 |
| 2016/0072034 A1* | 3/2016 | Kobayashi | H01L 35/32 136/205 |

FOREIGN PATENT DOCUMENTS

| | | |
|---|---|---|
| WO | 2004/030043 | 4/2004 |
| WO | 2008060642 | 5/2008 |

OTHER PUBLICATIONS

A.L. Briseno, et al: "Oligo-and Polythiopehne/Zno Hybrid Nanowire Solar Cells", Nano Lett. 2010, 10, p. 334-340.

A. Dev, et al. "Optical Applications of ZnO Nanowires", IEEE Journal of Selected Topics in Quantum Electronics, vol. 17, No. 4, p. 896-906, Jul./Aug. 2011.

B.J. Landi, et al. "CdSe Quantum Dot-Single Wall Carbon Nanotube Complexes for Polymeric Solar Cells", Solar Energy Materials and Solar Cells, 87, p. 733-746, Nov. 30, 2004.

Meng-Lin Lu, et al. "A Facile Integration of Zero and One Dimensional Nanomaterials: Fabrication of a Nanocomposite Photodetectorwith Ultrahigh Gain and Wide Spectral Response", Nano Letters, Bd. 13, No. 5, May 8, 2013.

B. Zebli, et al. "Optoelectronic Sensitization of Carbon Nanotubes by CdTe Nanocrystals", Physical Review B, Bd. 79, No. 20, May 1, 2009.

* cited by examiner

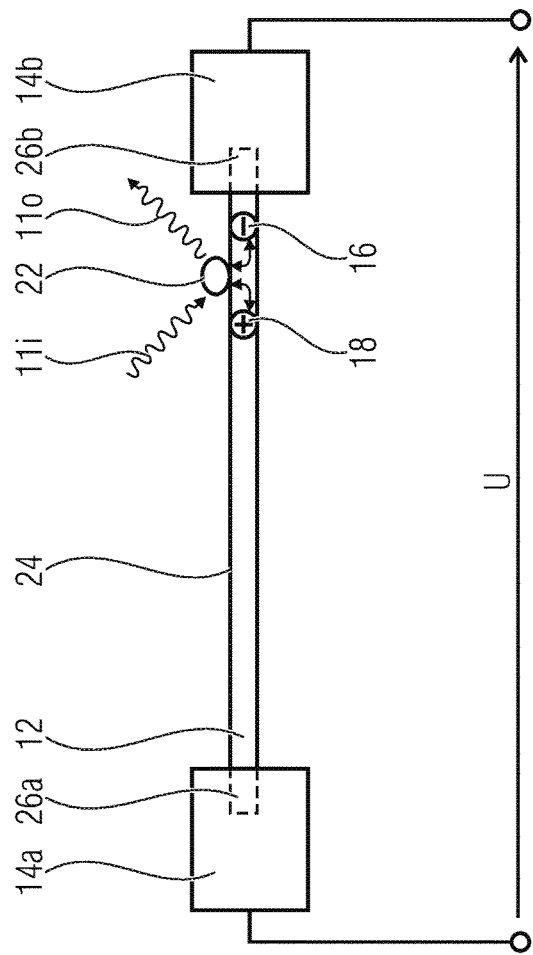

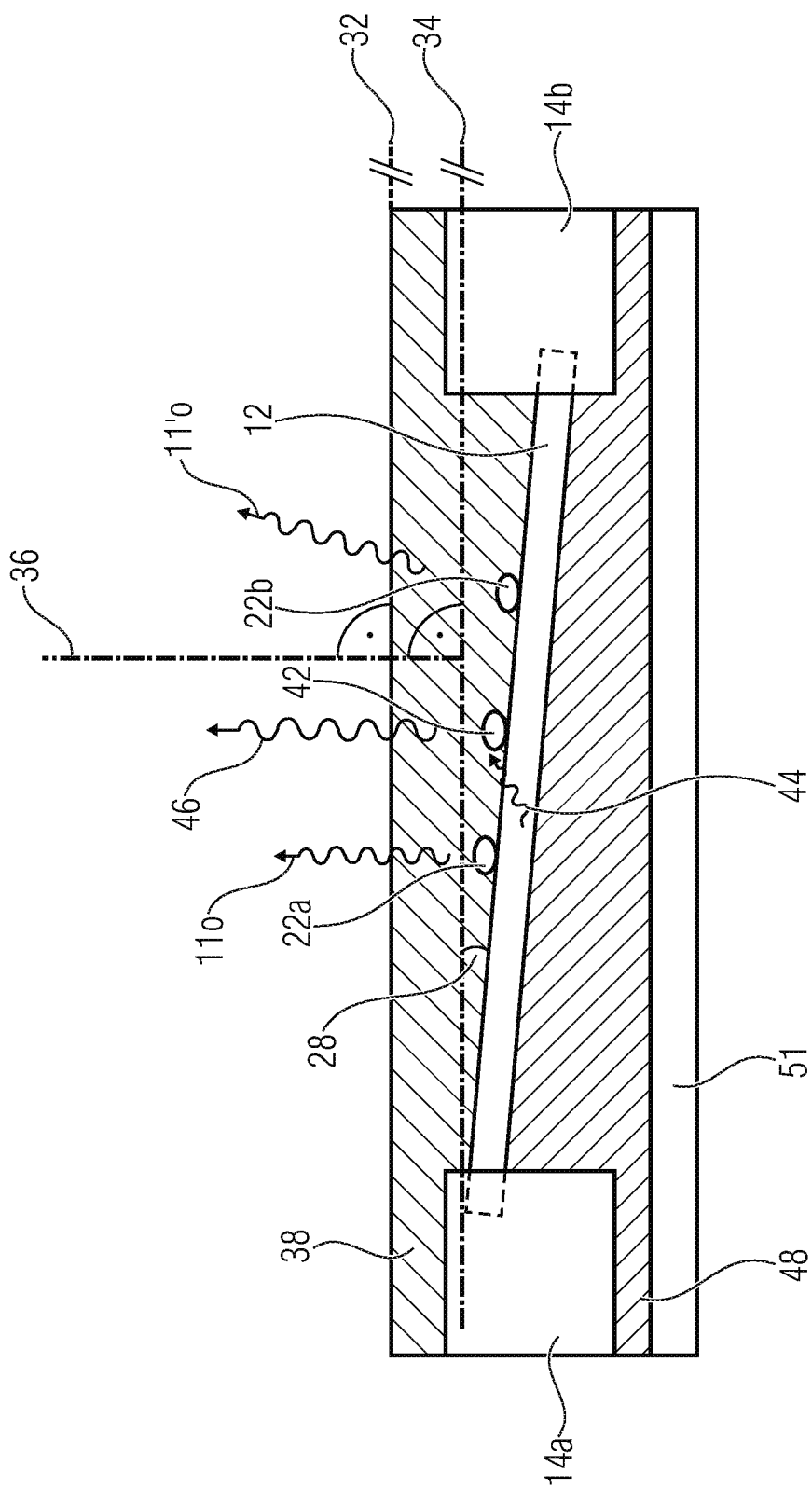

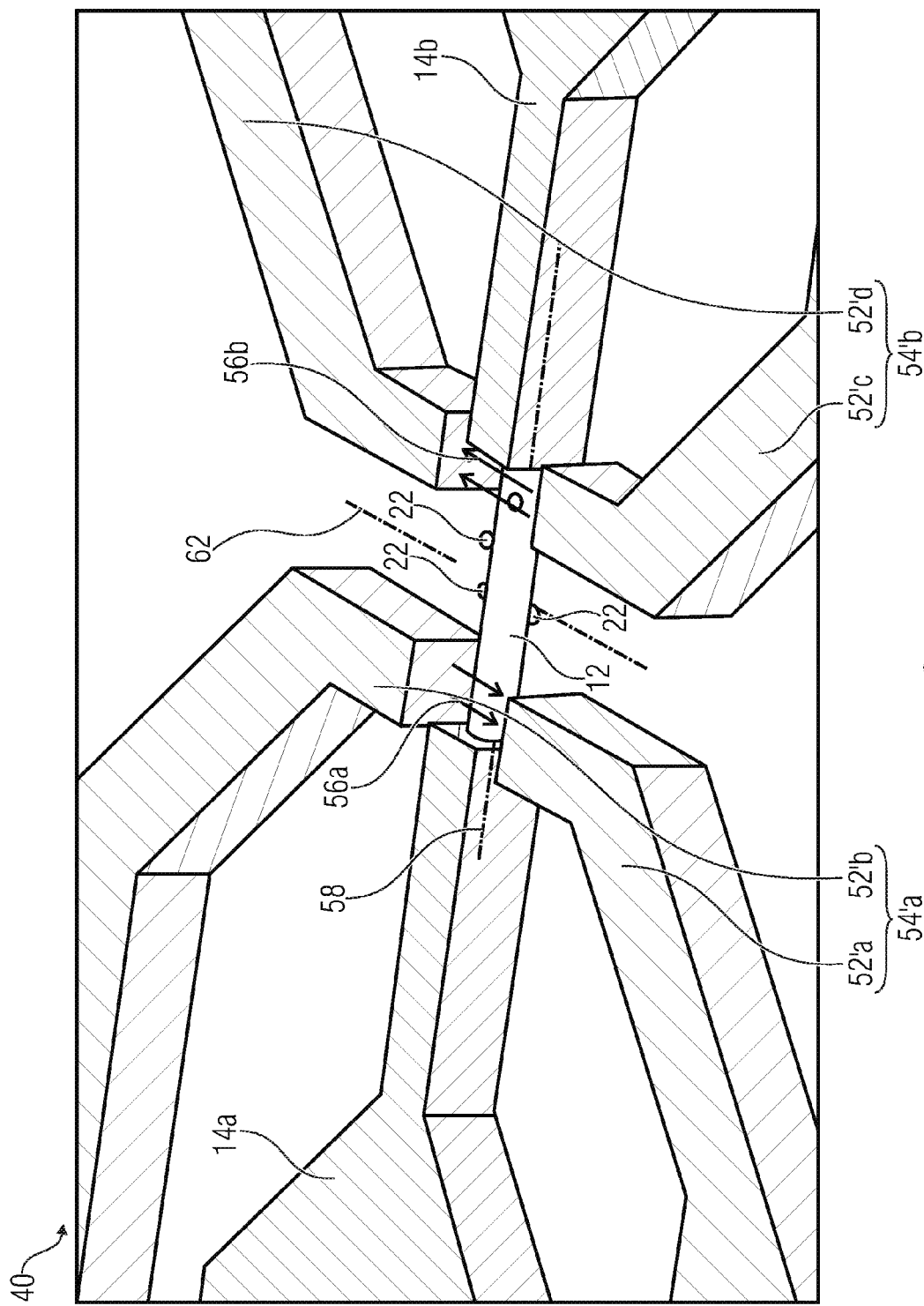

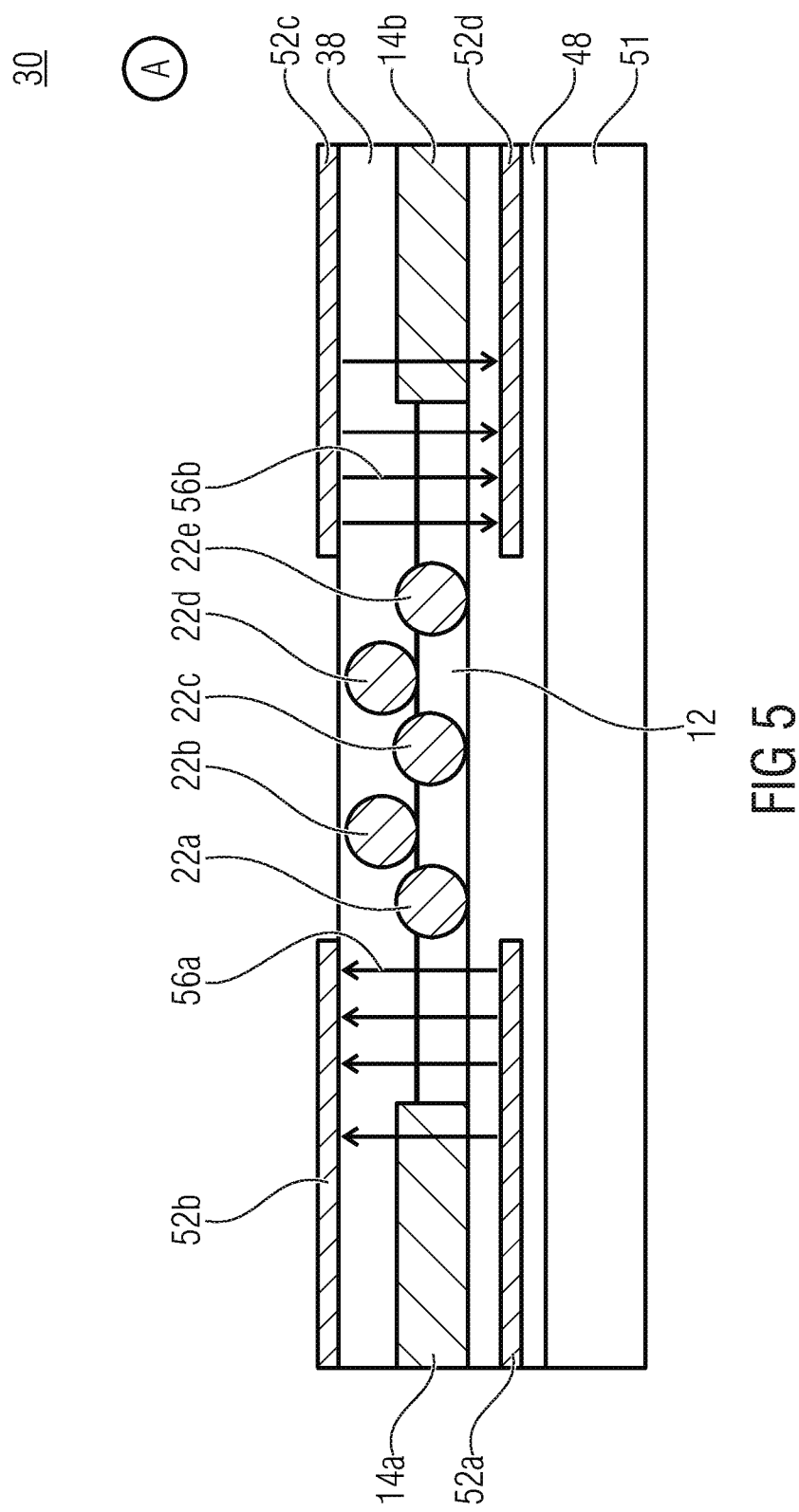

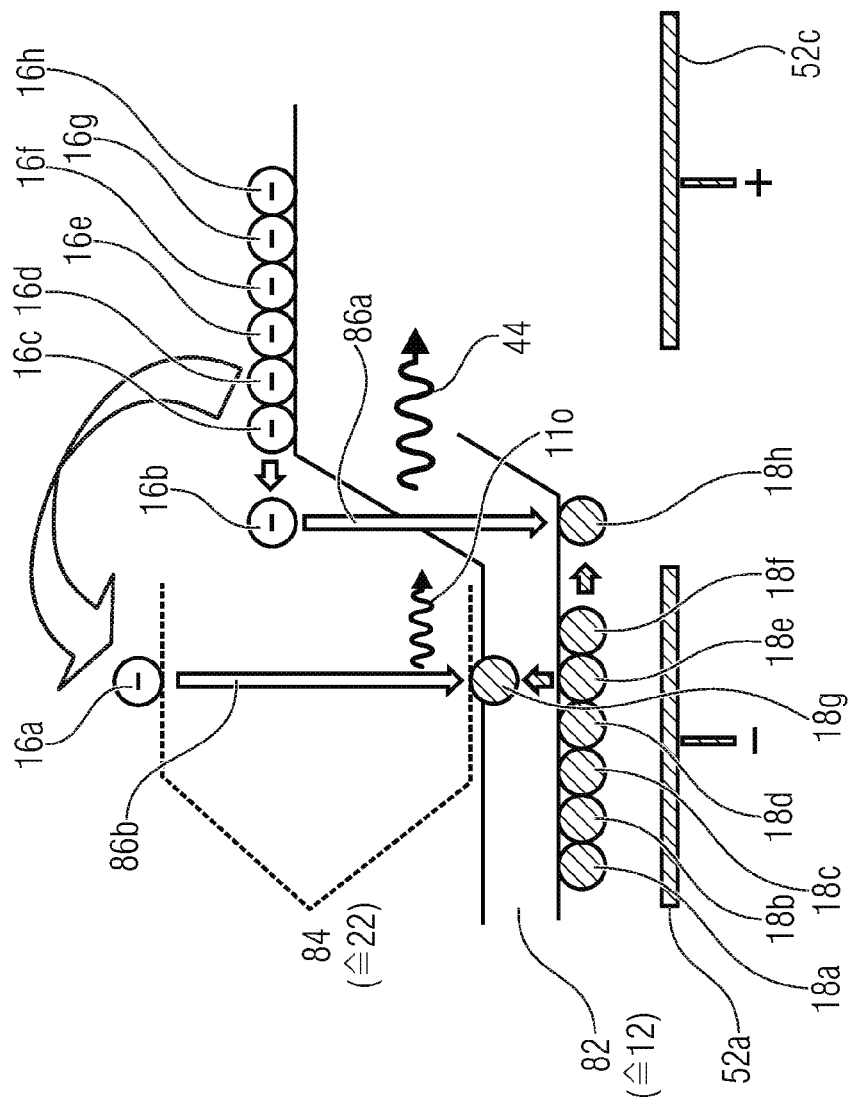

DEVICES FOR EMITTING AND/OR RECEIVING ELECTROMAGNETIC RADIATION, AND METHOD FOR PROVIDING SAME

CROSS-REFERENCE TO RELATED APPLICATIONS

This application is a continuation of copending International Application No. PCT/EP2014/072735, filed Oct. 23, 2014, which is incorporated herein by reference in its entirety, and additionally claims priority from German Application No. 10 2013 221 758.7, filed Oct. 25, 2013, which is also incorporated herein by reference in its entirety.

BACKGROUND OF THE INVENTION

Embodiments of the present invention relate to a device for emitting and/or receiving electromagnetic radiation by means of a radiation molecule arranged at an electrically conductive nanostructure, and to a method for providing same. Further embodiments relate to a device for emitting electromagnetic radiation with a radiation molecule or light converter molecule and control electrode means.

There is demand for small, efficient, tunable and easy-to-integrate light sources in many cases of application, such as, for example, for telecommunications, information technology, consumer electronics and medical engineering.

High-performance LEDs (light-emitting diodes) or diode lasers which, however, may necessitate much space and partly exhibit high an energy consumption are mostly used for such applications. In addition, these light sources or devices may only be adapted to the respective intended application to a relatively limited extent. This applies to both the structural shape and the light wavelength emitted.

U.S. Pat. No. 8,373,157 "Carbon Nano Tube (CNT) Light Emitting Device and Method of Manufacturing the Same" describes a carbon nanotube LED in which a plurality of carbon nanotubes are arranged in a layer. Doping the CNTs here takes place via respective n-doped or p-doped polymer layers such that a distribution of charge carriers of electrons and electron holes cannot be adjusted freely during operation. An emission wavelength of the electromagnetic radiation is restricted to the infrared range.

US 2005/045867 "Nanoscale Heterojunctions and Methods of Making and Using thereof" teaches light-emitting diodes consisting of individual quantum dots (QDs) as a luminophore, i.e. light-emitting particles, and contacted via carbon nanotubes. In addition, methods of manufacturing the same are described. The transitions from electrodes to carbon nanotubes are referred to as heterojunctions meaning that the source-drain current, apart from the contact resistances at the source and drain electrodes, experiences another contact resistance at a material or doping boundary within the contacting path, i.e. between a carbon nanotube and a QD. This means that the source-drain current flows through the QDs.

DE 10 2008 035559 "Elektrolumineszenz oder Photovoltaikquelle" (electroluminescence or photovoltaic source) teaches a setup of a quantum dot-based LED and a voltage source, wherein a light-emitting particle is arranged between the two electrodes such that material junctions/transitions between electrodes and/or light-emitting particles form part of the circuit.

DE 10 2008 015118 "Raumtemperatur-Quantendraht-(Array)-Feldeffekt-(Leistungs-) Transistor "QFET", insbesondere magnetisch "MQFET", aber auch elektrisch oder optisch gesteuert" (ambient-temperature quantum wire (array) field-effect (power) transistor "QFET", in particular magnetic "MQFET", but also controlled electrically or optically) teaches devices of a quantum wire array consisting of several groups of densely packed quantum wires inclined vertically in its setup or up to 30° to the perpendicular, i.e. 30° to a vertical or surface normal. The devices may be referred to as quantum wire transistor. The main field of application is the usage as a photodetector.

US 2008/017845 "Nanostructure Assemblies, Methods and Devices Thereof" teaches devices in which nanostructures are bound to bridge molecules adjacently and covalently and which allow the emission of electromagnetic radiation based on recombination processes in the carbon nanotubes.

WO 2004/030043 "Molecular Light Emitting Device" teaches a carbon nanotube LED i.e. already doped.

The object of the present invention is providing devices and methods which allow a more energy-efficient and/or tunable source of electromagnetic radiation, if possible with a small structural shape.

SUMMARY

According to an embodiment, a device for emitting or detecting electromagnetic radiation may have: a first electrode and a second electrode; at least one electrically conductive nanostructure which connects the first electrode and the second electrode to each other and is configured to transport electrons and holes from the first and the second electrode or to the first and the second electrode; and at least one nanoscopic material structure arranged at a circumferential surface of the electrically conductive nanostructure, configured to absorb electrons and holes or electromagnetic radiation and emit the electromagnetic radiation with recombination of electrons absorbed and holes absorbed, or emit electrons and holes based on the electromagnetic radiation absorbed; wherein an end of the electrically conductive nanostructure arranged at the first or the second electrode is surrounded at least partly by the first or second electrode along a region of the circumferential surface in order to provide electrical contact between the first or second electrode and the electrically conductive nanostructure, wherein the device additionally has at least one of: control electrode means arranged to be adjacent to the electrically conductive nanostructure and configured to influence, when applying an electric voltage to the control electrode means by means of an electric field generated, an energy level of holes or electrons in the electrically conductive nanostructure; and a first material which forms the first electrode at least partly, and a second material which forms the second electrode at least partly, wherein the first material and the second material have a mutually different work function relative to the holes or electrons.

According to another embodiment, a device for emitting electromagnetic radiation may have: a first and a second electrode; at least one electrically conductive nanostructure the first electrode and the second electrode connecting to each other and configured to receive electrons and holes from the first and the second electrode and emit the electromagnetic radiation at a first wavelength with a recombination of holes received and electrons received; at least one light converter molecule arranged at a circumferential surface of the electrically conductive nanostructure, having, at least partly, phosphorescent or fluorescent substances and configured to receive the electromagnetic radiation at the first wavelength at least partly and emit electromagnetic radiation at a second wavelength based on a fluorescence or phosphorescence; at least two control electrode means configured to influence, when applying an electric voltage to the at least two control electrode means by means of a first and second electric fields generated, an energy level of holes or electrons in the electrically conductive nanostructure.

Another embodiment may have an assembly having at least two devices of the types as mentioned above, wherein the devices are controllable separately from one another, and wherein the devices are configured to emit the electromagnetic radiation in a mutually different wavelength; or
wherein the devices are configured to receive the electromagnetic radiation in a mutually different wavelength; or
wherein the devices are configured to receive the electromagnetic radiation at essentially identical wavelengths; or
wherein at least one device of the at least two devices is configured to emit the electromagnetic radiation, and at least another device of the at least two devices is configured to receive electromagnetic radiation.

According to another embodiment, a method for providing a device for emitting or receiving electromagnetic radiation may have the steps of: arranging a first and a second electrode; connecting the first electrode and the second electrode to at least one electrically conductive nanostructure for transporting electrons and holes from the first and the second electrode or to the first and the second electrode such that an end of the electrically conductive nanostructure arranged at the first or the second electrode is surrounded at least partly by the first or second electrode along a region of the circumferential surface in order to provide electrical contact between the first or second electrode and the electrically conductive nanostructure; arranging at least one nanoscopic material structure at a circumferential surface of the electrically conductive nanostructure for absorbing electrons and holes or electromagnetic radiation and emitting the electromagnetic radiation with recombination of electrons absorbed and holes absorbed, or emitting electrons and holes based on the electromagnetic radiation absorbed; and arranging at least one of: control electrode means arranged to be adjacent to the electrically conductive nanostructure such that, when applying an electric voltage to the control electrode means by means of an electric field generated, an energy level of holes or electrons in the electrically conductive nanostructure may be influenced; and a first material such that the first material forms the first electrode at least partly, and a second material such that the material forms the second electrode at least partly, and such that the first material and the second material have a mutually different work function relative to the holes or electrons.

The central idea of the present invention is having recognized that devices comprising electrically conductive nanostructures may form efficient sources of electromagnetic radiation with a small structural shape when radiation molecules configured to emit electromagnetic radiation are arranged at the nanostructures, or when the device comprises at least two control electrode means configured to influence at least an energy level of one type of charge carrier in the electrically conductive nanostructure.

In accordance with an embodiment of the present invention, a device for emitting electromagnetic radiation includes at least one electrically conductive nanostructure which connects to each other a first and a second electrode. The device comprises a radiation molecule configured to emit electromagnetic radiation based on a recombination of electrons and holes having been received from the electrically conductive nanostructure or to provide electrons and holes to the electrically conductive nanostructure based on electromagnetic radiation received. At least an end of the electrically conductive nanostructure arranged at the first or second electrode is surrounded by the first or second electrode along a region of the circumferential surface of the nanostructure in order to provide an electric contact.

By recombining electrons and holes in the radiation molecule, a wavelength of electromagnetic radiation adjustable at high position may be emitted. Small a transition resistance between the first or second electrode and the nanostructure may be generated by surrounding the region of the circumferential surface of the electrically conductive nanostructure. In addition, the device may be used both as a photodetector and a radiation source.

In accordance with an alternative embodiment, a device for emitting electromagnetic radiation comprises an electrically conductive nanostructure and at least to control electrode means which are arranged, at least in portions, along an axial orientation of the electrically conductive nanostructure such that applying an electric voltage to a control electrode means may generate an electric field configured to influence at least an energy level of electrons or holes in the electrically conductive nanostructure.

By arranging control electrode means, an electric potential may be altered in sections along the axial orientation of the electrically conductive nanostructure and, thus, an intensity, i.e. brightness, or wavelength of electromagnetic radiation which is based on recombination of electrons and holes in the electrically conductive nanostructure may be influenced.

BRIEF DESCRIPTION OF THE DRAWINGS

Embodiments of the present invention will be detailed subsequently referring to the appended drawings, in which:

FIG. 1 is a schematic side view of a device for emitting or detecting electromagnetic radiation;

FIG. 2 is a schematic side view of a device for emitting or detecting electromagnetic radiation with two radiation molecules and a light converter molecule;

FIG. 4A is a schematic perspective view of a device comprising control electrodes which exhibit an alternative electrode shape compared to the control electrodes having been described in FIG. 3;

FIG. 5 is a schematic cross-sectional view of the device of FIG. 3A in a sectional plane;

FIG. 9 is a schematic illustration of a band structure of an electrically conductive nanostructure and of a band structure of a radiation molecule;

DETAILED DESCRIPTION

Figure 3A:
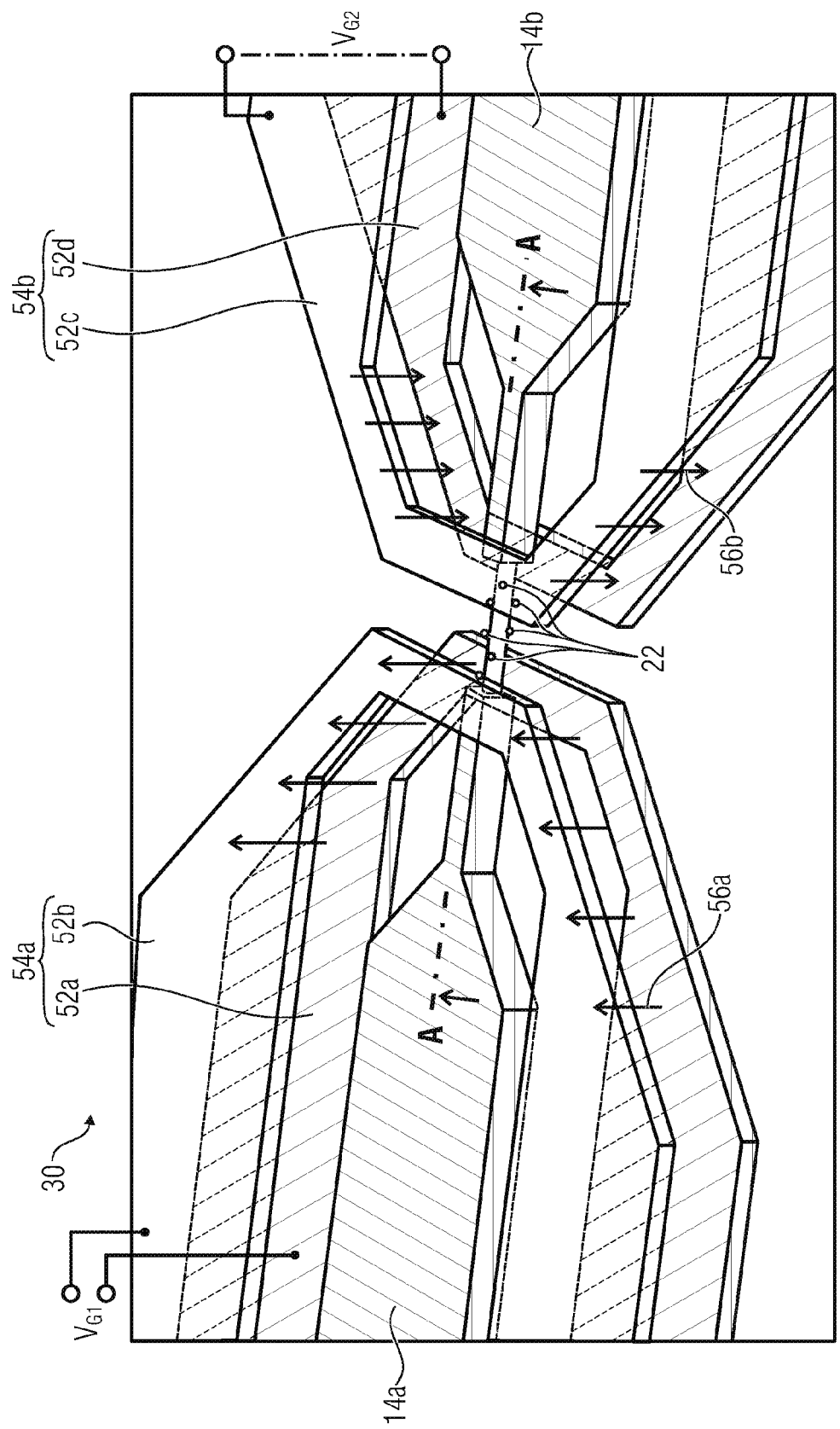
FIG. 3A is a schematic perspective view of a device which comprises a plurality of radiation molecules and control electrodes.

Before discussing below in greater detail embodiments of the present invention referring to the drawings, it is pointed out that identical elements, objects and/or structures or those of equal function or equal effects are, in the different figures, provided with the same reference numerals such that the description of these elements illustrated in different embodiments is mutually exchangeable or mutually applicable.

FIG. 1 shows a schematic side view of a for emitting or detecting electromagnetic radiation. The device 10 includes an electrically conductive nanostructure 12 which connects to each other a first electrode 14a and a second electrode 14b. The electrically conductive nanostructure 12 is configured to transport electrons 16 and holes 18 from the electrodes 14a and 14b towards a radiation molecule or light-emitting molecule 22 and/or from the radiation molecule 22 towards the electrodes 14a and 14b.

The radiation molecule 22 is arranged at a circumferential surface 24 of the electrically conductive nanostructure 12 and configured to emit the electromagnetic radiation 11o or receive electromagnetic radiation 11i with a recombination of electrons 16 and holes 18 in the radiation molecule 22 and emit electrons 16 and holes 18 based on the electromagnetic radiation 11i received (charge carrier separation). Tunneling effects between the electrically conductive nanostructure 12 and the radiation molecule 22 allow the electrons 16 and holes 18 to pass from the electrically conductive nanostructure 12 to the radiation molecule 22 or the electrons 16 and holes 18 to pass from the radiation molecule 22 to the electrically conductive nanostructure 12.

The ends of the electrically conductive nanostructure 12 are surrounded at least partly or completely by the first electrode 14a and the second electrode 14b along the regions 26a and 26b of the electrically conductive nanostructure 12 and, thus, the circumferential surface 24 in order to provide an electrical contact between the first electrode 14a and the electrically conductive nanostructure 12 or between the second electrode 14b and the electrically conductive nanostructure 12. Such an electrical contact provided at the circumferential surface 24 may exhibit a reduced transition resistance for example compared to contacting at a cross-sectional area between the electrically conductive nanostructure 12 and the first electrode 14a or the second electrode 14b. This may be achieved by embedding the nanostructure at least partly into the corresponding electrode, wherein a subarea of the circumferential surface 24 in the regions 26a and 26b contacts the first and second electrodes, respectively. This may be of particular advantage when the electrically conductive nanostructure 12 comprises a very small diameter or a very small dimension perpendicularly to an axial extension and, thus, a very small cross-sectional area.

In other words, the ends of the electrically conductive nanostructure are completely embedded in the first electrode 14a or the second electrode 14b, i.e. they are enclosed by electrode material instead of resting on the electrodes 14a and 14b, which is referred to as bridging. This may also be referred to as a completely integrated electrically conductive nanostructure.

The electrodes 14a and 14b, at least in some embodiments, comprise a mutually different work function for electric charge carriers, like electrons and holes. Applying a voltage U between the first electrode 14a and the second electrode 14b results in electrons 16 and holes 18 to enter into the electrically conductive nanostructure 12. The electrically conductive nanostructure 12 exhibits semiconductor characteristics such that the electrons 16 and holes 18 may be separated and, with different work functions at the first and second electrodes, comprise mutually different energy levels.

Electron-deficient and electron-rich regions and, thus, operating points of the device along the electrically conductive nanostructure may be adjusted using asymmetrical source-drain contacts, i.e. metals of different work functions for the electrodes 14a and 14b. The work function here may be dependent on the respective electrode material used. In particular, matching different electrode materials, like aluminum, copper, gold or silver, may take place such that electrons 16 and holes 18 of certain energies are released to the electrically conductive nanostructure 12 or received by it. Suitable material combinations are, for example, calcium vs. palladium or scandium vs. palladium.

In other words, due to the difference in energy levels, band bending occurs in the contacted semi-conducting nanostructure between the electrodes when the first and second electrodes consist of metals with different work functions. When adjusting a (non-disappearing) voltage between the first and second electrodes (source-drain voltage), electrons are injected from the metal electrode of a higher work function into the conduction band and, at the same time, holes injected from the metal electrode with a lower work function into the valence band of the semi-conducting nanostructure. The forward and reverse direction of the diode may be selected by the polarity (sign) of the source-drain voltage, i.e. the electric voltage between the electrodes 14a and 14b. Alternatively or additionally, the operating point of the device may be adjusted, i.e. shifted, using control electrode means. The control electrode means may be configured to influence an electric potential and, thus, an energy level of the electrodes 16 and/or holes 18 in regions along the electrically conductive nanostructure.

The different work functions of the electrodes 14a and 14b and/or control electrode means allow the difference in energy between the electrons 16 and holes 18 to be adjusted. The difference in energy may influence a probability at which the electron 16 and the holes 18 are tunneling from the electrically conductive nanostructure 12 into the radiation molecule 22. The probability $P_T$ of tunneling may be expressed as follows:

$$P_T(E) = \frac{1}{1 + \frac{V_0^2}{4E(V_0 - E)}\sinh^2(2\kappa a)}$$

wherein $V_0$ is the potential barrier between the nanostructure and the radiation molecule, E is the energy of the charge carriers, $\kappa$ is the imaginary impulse and a is the amplitude of the complex wave functions of the respected charge carriers (electrons, holes) in the barrier.

Thus, states which favor predominant or at least partial recombination of the charge carriers in the radiation molecule may be achieved. Thus, recombination within the semiconducting nanostructure is considered to be a competing process which, however, may be available for applications for additional emissions, like in the infrared range.

As has been discussed before, the electrons 16 and holes 18 may tunnel into the radiation molecule 22 based on the respective energy levels. The radiation molecule 22 is configured to emit the electromagnetic radiation 11o with a recombination of electrons 16 and holes 18 in the radiation molecule 22. In other words, when applying an electric voltage U to the electrodes 14a and 14b, the device 10 may be operated as a light emitter.

It is to be mentioned that the term light refers to electromagnetic radiation in a wavelength range which is not intended to be limited to a wavelength range visible for humans. Rather, the terms light and electromagnetic radiation will subsequently be used equivalently so as to allow improved clarity of the description. A potential wavelength range of the electromagnetic radiation 11o emitted may, for example, be in a wavelength range between 100 nm and 10,000 nm. In alternative embodiments, the wavelength range of the electromagnetic radiation 11o emitted may be in a wavelength range between 200 nm and 8,000 nm or between 300 nm and 7,000 nm.

The radiation molecule 22 is additionally configured to absorb incident electromagnetic radiation 11i and emit, based on the incident electromagnetic radiation 11i or based on an energy content of the incident electromagnetic radiation 11i, electrons 16 and holes 18 which may tunnel into the electrically conductive nanostructure 12. The electrons 16 and holes 18 may, depending on the work function of the respective electrodes, migrate towards the first or the second electrode 14a or 14b, wherein the direction of movement of the holes is opposite to the direction of movement of the electrons. This may result in a measurable voltage U between the first electrode 14a and the second electrode 14b, thereby allowing the device 10 to be operated as a photodetector.

The electrically conductive nanostructure 12 may be a one-dimensional or two-dimensional conductor. It is to be mentioned that the terms one-dimensional and two-dimensional conductor relate to the number of degrees of freedom in which, from a quantum-mechanical point of view, the wave functions of the charge carriers in the electrically conductive nanostructure 12 are not restricted (confinement). In a nanowire like, for example, a single-wall carbon nanotube (CNT), the quantum-mechanical wave function of electrons and holes is not limited in the axial direction, whereas it is subject to a quantum-mechanical limitation in the radial directions. Thus, a CNT may be referred to as a one-dimensional conductor. Graphene, for example, is formed from an atomic layer of graphite. This means that the atomic nuclei or molecules are arranged in a planar lattice structure or a planar honeycomb lattice structure. Usually, graphene is referred to as a two-dimensional conductor. This type of defining dimensionality is generally recognized although the atomic nuclei or molecules which form the lattice structure of the nanotube or graphene really exhibit a three-dimensional extension as regards length, height and/or width or a three-dimensional diameter so that nanotubes and graphene also exhibit dimensions in three spatial directions. A nanowire may, for example, comprise a diameter of a few up to some nanometers such that, for many applications only an axial extension of the wire is relevant, resulting in nanowires (which really are three-dimensional) to be referred to as a one-dimensional structure.

In other words, the electrically conductive nanostructure 12 may be a one-dimensional conductor, like a lineup of conductive molecules, nanowires, nanotubes (like CNTs), nanoribbons or nanohorns, or a two-dimensional conductor, like graphene, a silicene or metallic chalcogenide. The electrically conductive nanostructure 12 exhibits semi-conducting characteristics such that electrons 16 and holes 18 are subject to charge separation. In the case of a photodetector, the charge carriers are generated when a light quantum impinges and released to the conduction band (electrons) or valence band (holes). In the case of a light-emitting diode, the charge carriers may recombine from same. A medium free path length, i.e. a distance of little interaction with atoms, in a CNT, is roughly 10 μm. Within the free path length, an electrically conductive nanostructure has good transport characteristics for electrons and holes.

Localizing the electrically conductive nanostructure 12 may, for example, take place by a directed deposition from the liquid phase, field-supported, if applicable, i.e. based on an electric field, like by dielectrophoresis (DEP), for example.

Alternatively, localization of the electrically conductive nanostructure 12 may also take place directly by chemical vapor deposition (CVD), since these are present on the substrate directly after growing in a localized manner.

The radiation molecule 22 may, for example, be a quantum dot (QD). The radiation molecule 22 may alternatively be a colloidal, i.e. basically spherical radiation molecule. Alternatively, the radiation molecule 22 may also be an elongated colloidal quantum structure with an aspect ratio unequal to 1. This means that the radiation molecule 22 exemplarily exhibits a shape in which a width, height or length is larger than one or two of the remaining dimensions. Expressed in a simplified manner, an elongated colloidal quantum structure may, for example, exhibit an oblong or oval form. The advantage of elongated radiation molecules would be that these attach longitudinally to an electronic nanostructure and thus allow polarization-selective emission of electromagnetic radiation. The polarization direction of the electromagnetic radiation 11o depends on an orientation of the largest or smallest dimension of the radiation molecule 22 in space.

The radiation molecule 22, like a quantum dot, may be a nanoscopic material structure and include semiconductor materials. Exemplarily, the radiation molecule 22 may comprise II-IV semiconductor materials, like cadmium selenide (CdSe), III-V semiconductor materials, like indium phosphide (InP), or III-III-V semiconductor materials, like indium gallium arsenide (InGaAs) or gallium indium phosphide (GaInP). The degrees of freedom of the wave functions of electrons 16 and/or holes 18 in a radiation molecule 22 are limited to an extent such that the energy states thereof are distributed discretely. Thus, the electromagnetic radiation 11o emitted may comprise an essentially discrete wavelength range when the device 10 is operated as a light emitter. When using semi-conducting quantum dots as the radiation molecule, in addition emission may take place over a very narrow band, in the case of a low diameter distribution. If the device 10 is operated as an photodetector, the voltage U measured exhibits a value depending on an intensity of the electromagnetic radiation 11i. Thus, the minimum energy detectable may be adjusted freely by selecting the bandgap via the size of the quantum dots. In a first approximation, the energy corresponds to the bandgap.

The bandgap may be adjusted via the size of the radiation molecule. The radiation molecule 22 is arranged to be adjacent to the electrically conductive nanostructure 12 such that the electrons 16 and holes 18 overcome the potential barrier between the electrically conductive nanostructure 12 and the radiation molecule 22 and may tunnel to the conduction or valence band of the radiation molecule 22 with the existence of corresponding rules of selection, like energy and impulse conservation.

In other words, electrons 16 and holes 18 may flow, or tunnel, from the CNT to the QDs and recombine there while emitting light. By being operated as a well-controllable diode, a locally restricted region or several locally restricted regions are formed where electrons 16 and holes 18 may recombine with radiation entailed. Operation as a well-controllable diode results from the different work functions or the (respective) polarity of the control electrode(s). The emission wavelength and the light intensity of the device 10 here may be adjusted specifically by the size and the number of QDs bound per CNT. In order to additionally adapt the efficiency of the device, i.e. brightness or light yield per electric voltage applied, as desired, different modifications of QDs, light core shell systems, consisting of a core and one or several shells, may be applied. The first and second electrodes 14a and 14b are contacted by one and the same undoped molecule, which is also referred to as "homojunction". The radiation molecule 22, like a QD, thus is not a component of the path forming the source-drain current, i.e. electrically conductive path. By a reduced number of material junctions/transitions, a resulting electric overall resistance may be reduced, a power consumption of the device necessitated be reduced and an efficiency of the resulting device be improved.

The radiation molecule 22 may be arranged on the electrically conductive nanostructure 12 by means of covalent, i.e. chemically bound, bondings or based on one or several non-covalent bondings, like, for example, Van-der-Waals forces or ionic bondings.

In other words, the device 10 describes a setup of nanooptoelectronic light emitters or photodetectors which, due to the high flexibility as regards structural shape and wavelength emitted and received, is easy to integrate into optical systems as a light source or photodetector. The device 10 may, for example, be used in entertainment technology, like as an alternative to present OLED displays for smartphones or tablet computers. Using same as an efficient illuminant is also conceivable. In addition, the device 10 may be used wherever small, efficient, robust and, depending on the application, tunable light sources are necessitated. This applies, among other things, also in regions, such as medical engineering, telecommunications, data processing or spectroscopy. The device 10 may also be used as an efficient and, at the same time, easily controllable single-photon source for future quantum-optical applications in quantum cryptography or quantum information technology.

The emission of electromagnetic radiation based on charge carriers recombining within the electrically semiconducting nanostructure may be reduced or minimized by a filter which is, for example, arranged between the device 10 and an observer or receiver. This filter here may, for example, be realized using light converter molecules which are located on an electrically semi-conducting nanostructure 12 and/or within an insulation layer (see FIG. 2 and description of FIG. 2 below). Alternatively, the wavelength which is based on recombination in the electrically conductive nanostructure 12 may be used as a second, different wavelength in addition to the electromagnetic radiation 11o emitted or as an equal wavelength of the electromagnetic radiation 11o.

The device 10 may also be referred to as a light source including two sub-light sources. A first light source may be implemented as a radiation molecule 22 and a second light source in the form of the wavelength emitted based on recombination of electrons and holes in the electrically conductive nanostructure 12.

In other words, the device comprises CNT emission, which is competing with emission of the radiation molecules, depending on which portion of electrons 16 and holes 18 tunnels from the electrically conductive nanostructure 12 to the radiation molecule 22.

It is of advantage with this embodiment that a wavelength range which the device 10 emits or receives or evaluates, is adjustable at high precision in dependence on the implementation of the radiation molecule 22. The device 10 may be formed at small dimensions, i.e., for example, a surface area of less than 60×50 µm, less than 30×30 µm or less than 20×15 µm, and also be referred to as an optoelectronical nano-system based on colloidal quantum dots and semiconducting carbon nanotubes (CNTs). The small dimensions allow high energy efficiency of the device 10 and easy integration of the device. Based on the implementation of the radiation molecule 22, the device 10 exhibits good tunability of the wavelength emitted, i.e. small emission bandwidth, high contrast, high light intensity and high quantum yield.

FIG. 2 shows a schematic side view of a device 20 which comprises the first electrode 14a and the second electrode 14b. The electrodes 14a and 14b are connected via the electrically conductive nanostructure 12. The electrically conductive nanostructure 12 here is arranged such that it forms an angle 28 of less than or equaling 20° to a surface plane 32 or an auxiliary plane 34 arranged in parallel to the surface plane 32 of the device 20. In other words, the electrically conductive nanostructure 12 is basically horizontal.

The device 20 comprises two radiation molecules 22a and 22b. An electrically conductive nanostructure 12 which is essentially in parallel to the surface plane 32, i.e. has an angle of smaller than or equaling 20°, allows electromagnetic radiation to be emittable which may be made use of essentially in the direction of a perpendicular 36 to the surface plane 32. In addition, the device 20 comprises an insulation layer 38 which covers the electrodes 14a and 14b and the electrically conductive nanostructure 12, the radiation molecules 22a and 22b and a light converter molecule 42. The radiation molecule 22b is configured to emit electromagnetic radiation 11'o which comprises a wavelength range different from the electromagnetic radiation 11o. Alternatively, the radiation molecules may also emit electromagnetic radiation 11o or 11'o of an equal wavelength range.

The insulation layer 38 is configured to protect the covered components 14a, 14b, 12, 22a, 22b and 42 from external influences, like touching, oxidation or humidity. In addition, the insulation layer 38 is configured to prevent electrical contact between other components and the device. The insulation layer may, for example, be transparent or comprise materials configured to filter electromagnetic radiation in a wavelength range, like an infrared range, such that the exit of electromagnetic radiation 44 which is based on a recombination of electrons and holes in the electrically conductive nanostructure 12, is reduced or prevented when the device 20 is operated as a light emitter. Alternatively, sensitivity of the device 20 relative to different wavelength ranges may be adjusted based on the filtering characteristics, when the device 20 is operated as a photodetector.

The light converter molecule 42 is configured to receive electromagnetic radiation of a first wavelength and emit, based on the electromagnetic radiation received, electromagnetic radiation of a second wavelength. The light converter molecule 42 may exemplarily comprise fluorescent, phosphorescent or electroluminescent colorant molecules. Recombination of electrons and holes in the electrically conductive nanostructure 12 may, for example, result in the emission of electromagnetic radiation in a wavelength range, like the infrared range, for example. This wavelength range may be different from a wavelength range of the electromagnetic radiation 11o or 11'o emitted. The light converter molecule 42 may, for example, be tuned or implemented such that it receives from the electrically conductive nanostructure 12 electromagnetic radiation 44 emitted based on the recombination of electrons and holes and emits electromagnetic radiation 46 based on electroluminescence, fluorescence or phosphorescence. A wavelength range of the electromagnetic radiation 46 may be equal to or different from the wavelength range of the electromagnetic radiation 11o of the radiation molecules 22a and/or 22b.

In other words, the device 20 is configured to emit electromagnetic radiation 11o, 11'o, 44 and 46 which may exhibit a mutually different wavelength range. In this case, superimposition of wavelength ranges and, thus, the emission of colored, i.e. polychrome, light is made possible by correspondingly designing the electrically conductive nanostructure 12, the radiation molecules 22a and 22b, and the light converter molecule 42.

In addition, the device 20 comprises an insulation layer 48 configured to insulate the electrodes 14a, 14b, the electrically conductive nanostructure 12 and/or the radiation molecules 22a, 22b or the light converter molecule 42 electrically from a substrate 51. The substrate 51 may, for example, be a silicon layer or a film. The insulation layer 48 may, for example, include silicon oxide.

It is of advantage with this embodiment that a light spectrum of a device is adjustable by combining wavelengths based on two, a plurality of or a multitude of radiation molecules.

Figure 3B:
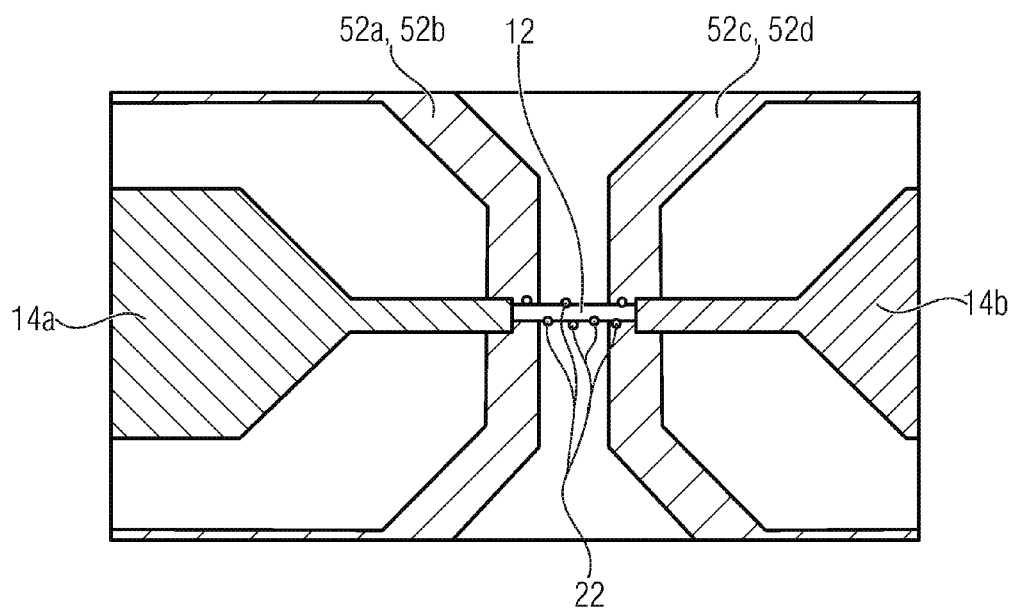
FIG. 3B is a schematic top view of the device of FIG. 3A.
Figure 3C:
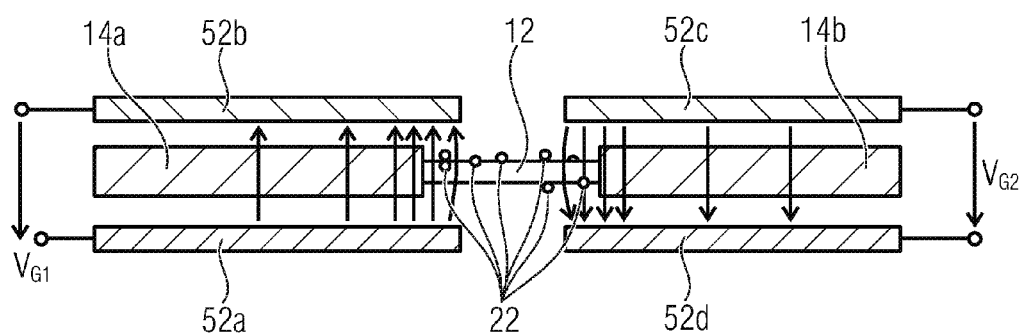
FIG. 3C is a schematic side view of the device of FIG. 3A.

FIG. 3A shows a schematic perspective view of a device 30 which comprises a plurality of radiation molecules 22 arranged at the circumferential surface of the electrically conductive nanostructure 12. The electrodes 14a and 14b connected by the electrically conductive nanostructure 12 comprise materials of equal work function. In other words, the two electrodes 14a and 14b are formed from the same material. FIG. 3B shows a schematic top view of the assembly 30 and FIG. 3C shows a schematic side view of the assembly 30. A schematic lateral sectional view of the device 30 in a sectional plane A-A is illustrated in FIG. 5.

The device 30 comprises two control electrode means 54a and 54b comprising four control electrodes 52a-d. The control electrodes 52a and 52b and 52c and 52d are each arranged opposite of one another such that the electrically conductive nanostructure 12 is arranged between the electrodes 52a and 52b and 52c and 52d. The control electrode means 54a includes the control electrodes 52a and 52b and is arranged adjacent to the first electrode 14a. Control electrode means 54b includes the control electrodes 52c and 52d and is arranged adjacent to the first electrode 14b.

The control electrode means 54a and 54b are configured to generate, when applying a voltage $V_{G1}$ to the control electrode means 54a or a voltage $V_{G2}$ to the control electrode means 54b, an electric field 56a and 56b, respectively. As is easy to recognize from FIGS. 3B and 3C, the control electrodes 52a and 52b are arranged relative to the nanostructure 12 and the first electrode 14a in a way such that the electric field 56a generated by them is present, above all, at the position of the contact between the electrically conductive nanostructure 12 and the first electrode 14a. The control electrodes 52c and 52d are also arranged such that the corresponding electric field 56b is applied, above all, at the position of the contact between the electrically conductive nanostructure 12 and the second electrode 14b. A field strength course of the electric field 56a and the electric field 56b here may, depending on an electrode voltage applied, be of equal sign (electric field lines in parallel orientation) or, alternatively, of different signs (electric field lines in anti-parallel orientation), with equal or mutually different strength. A voltage $V_{G1}$ and/or a voltage $V_{G2}$ here may be of a greater magnitude than a voltage between the electrodes 14a and 14b.

Based on the assembly of the control electrode means 54a and 54b such that the electrically conductive nanostructure 12 is arranged between the control electrodes 52a and 52b and between the control electrodes 52c and 52d, the electrically conductive nanostructure 12 may be influenced in particular within the respective contact region 26a, 26b. The control electrodes 52a-d may adjust an energy difference between electrons and holes.

The control electrode means 54a and 54b are configured to influence, based on the electric fields 56a and 56b, an energy level of holes and/or electrons such that the tunneling probability PT is controllable.

In other words, the electric fields 56a and 56b are configured to modify the potential of the electrically conductive nanostructure 12 and thus favor a recombination of electrons and holes precisely in the radiation molecule 22.

Illustrated in a simplified manner, a design of the device 30 may be traced back to the design of a field-effect transistor (FET). The electrodes 14a and 14b may be referred to as source and drain and the control electrodes 52a-d as gate electrodes. When the electrodes 14a and 14b exemplarily comprise a mutually differing work function, the electrodes 14a and 14b may, based on the respective work function, also be referred to as source and drain, wherein the designation may also be exchanged based on the electric fields 56a and 56b. The opposing control electrodes 52a and 52b and 52c and 52d allow nearly homogenous electric fields 56a and 56b to be generated.

In contrast to the devices 10 and 20, as are illustrated in FIGS. 1 and 2, the electron-deficient and electron-rich regions may, alternatively or in addition to the asymmetrical source-drain contacts, i.e. electrodes 14a and 14b made of metals of different work functions, also be adjusted based on the control electrode means 54a and 54b. When a plane in which the electrically conductive nanostructure 12 is arranged between the control electrodes 52a and 52b and 52c and 52d is considered to be a horizontal plane, the electrodes 52b and 52c may be referred to as top gates, the electrodes 52a and 52d as bottom gates. Thus, top gates and bottom gates only refer to an illustrative description, without limiting the electrodes 52a-d to a certain orientation in space.

Alternatively, only one of the control electrodes 52a-d may, for example, be arranged to be adjacent to one of the electrodes 14a or 14b when the electrodes 14a and 14b comprise mutually different work functions. Alternatively, control electrode means 54a and/or 54b may comprise only one control electrode 52a or 52b or 52c or 52d. An electric field 56a or 56b generated by a single control electrode 52a or 52b or 52c or 52d may be more inhomogeneous compared to a field generated by two opposing electrodes 52a and 52b and 52c and 52d. However, manufacturing and/or the space necessitated for the device may, for example, be reduced.

The control electrode means 54a or 54b may, expressed differently, be formed from one or several control electrodes 52a-d. When the electrodes 14a and 14b comprise mutually different work functions, an operating point of the device 30 may be influenced using a control electrode means 54a or 54b.

When the electrodes 14a and 14b comprise identical work functions, an operating point of the device, i.e., for example, a light intensity emitted, may be adjusted by two or more control electrode means by 54a and 54b. When a control electrode means 54a or 54b comprises two opposing electrodes, an electric field 56a or 56b of greater homogeneity may be generated, which may allow more efficient operation of the device, i.e. a higher field intensity is achievable per voltage applied at the position of contact between the electrically conductive nanostructure and the first or second electrode. In other words, using at least four gate electrodes as control electrodes, for example, a homogeneous electric field may be realized, irrespective of the source and drain contacts at the electrodes 14a and 14b, whereas an inhomogeneous field is generated using two top gate electrodes or two bottom gate electrodes, for example. Thus, the efficiency of the device may be adjusted, i.e. a potentially more complicated realization using additional electrodes allows a lower energy consumption by generating homogenous electric fields.

When the control electrode means 54a or 54b are implemented such that two opposing electrodes 52a and 52b or 52c and 52d provide a homogeneous electric field 56a or 56b for influencing the energy level of electrons and/or holes and when a number n of these control electrode means 54a or 54b are arranged each having two electrodes, these may be referred to as 2n gates, dual, quattro, hexa or okto gates.

In other words, the role of the work function may alternatively or in addition to the different work functions of the electro material, also be achieved using at least two control electrode means 54a and 54b. Thus, the control electrodes are each neighboring to a semiconductor-metal junction/transition between the ends of the semi-conducting nanostructure 12 and the first or second (metal) electrode 14a or 14b. The band structure of the semi-conducting nanostructure 12 is caused to bend by this potential difference such that—in analogy to the case of only electrodes 14a and 14b of materials with different work functions—when correspondingly selecting a (non-disappearing) electric voltage between the first and the second electrodes 14a and 14b (source-drain voltage), electrons may be injected from the metal electrode at a lower control electrode voltage into the conduction band and, at the same time, holes be injected from the metal electrode with a higher control electrode voltage into the valence band of the semi-conducting nanostructure 12. Forward and reverse directions of the diode generatable in this way may thus be selected by the polarity (sign) of the source-drain voltage. In the case of equal work functions for both electrodes, the forward and reverse directions may additionally optionally be reversed by the polarity (sign) of the control electrodes since this is a completely symmetrical system.

Thus, switching on, switching off or reversing the field polarities may influence a forward direction and/or a reverse direction of a light-emitting diode having an electrically conductive nanostructure and a radiation molecule. Thus, the forward direction and the reverse direction may be reversed when the electrodes 14a and 15b comprise equal work functions. Thus, resonant operation of phases where electromagnetic radiation 11o is emitted or not emitted may be achieved, for example, by activating, deactivating or varying the field strengths and/or orientations. This may be of advantage, for example, in telecommunications technology applications, when resonant operation is used for modulating a light signal emitted.

It is of advantage with this embodiment that an assembly of control electrode means 54a and 54b allows the operating point of the device to be adjusted when the electrodes 14a and 14b comprise equal or different work functions.

Figure 4B:
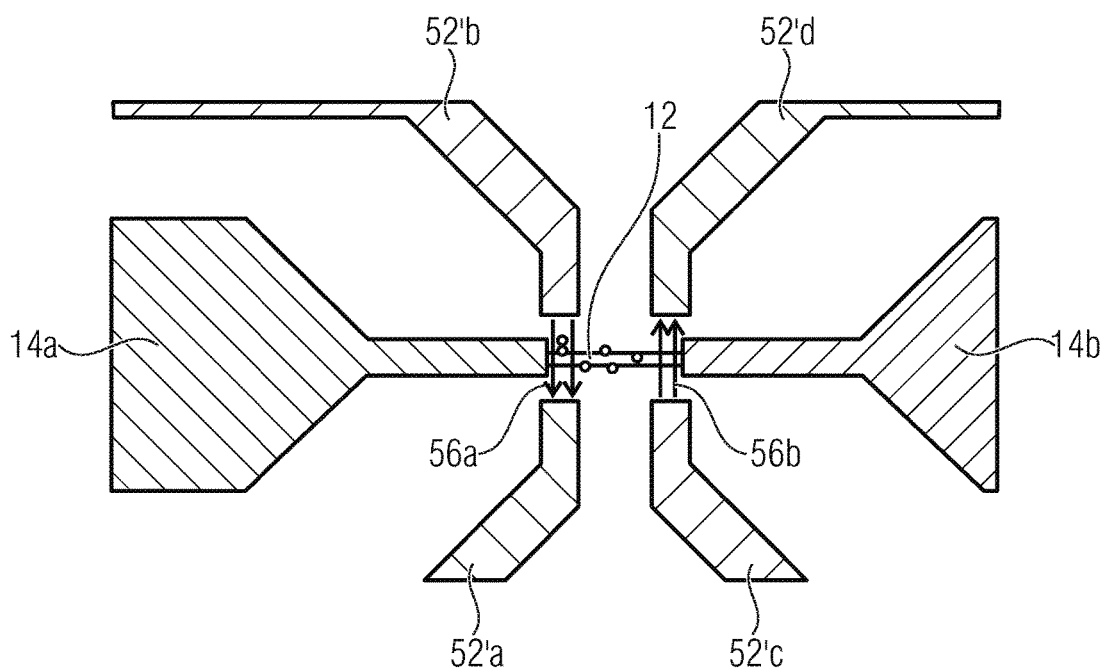
FIG. 4B is a schematic top view of the device of FIG. 4A.
Figure 4C:
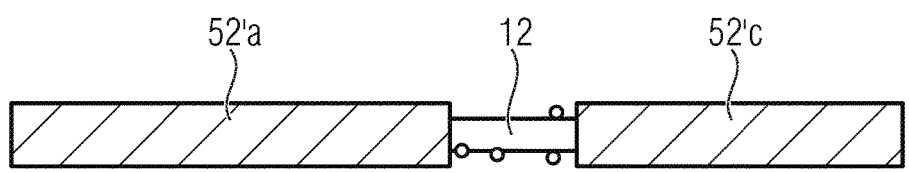
FIG. 4C is a schematic side view of the device of FIG. 4A.

FIG. 4A shows a schematic perspective view of a device 40 comprising control electrodes 52'a to d which exhibit an alternative electrode shape compared to the control electrodes 52a to d of the device 30 as described in FIG. 3. FIG. 4B shows a schematic top view of the assembly 40 and FIG. 4C shows a schematic side view of the assembly 40.

The control electrodes 52'a to d are arranged within one plane. When this plane is considered to be the horizontal claim, the control electrodes 52'a to d may be referred to as side gates. The control electrodes 52'a to d may be arranged alternatively or in addition to the control electrodes 52a to d of FIG. 3a. In other words, depending on the application, different gate configurations, like top gates, bottom gates, side gates, or the like, for example, may be used for controlling the electron-deficient or electron-rich regions.

When an axial direction of the electrically conductive nanostructure 12 is considered as a connective axis 58 between the electrodes 14a and 14b, the control electrodes means 54'a and 54'b, for example, are arranged in a lateral direction 62, arranged perpendicularly to the connective axis 58.

It is of advantage with this embodiment that the device 40, for example, compared to the device 30, may be implemented at a smaller dimension in a light emission direction, i.e. a smaller structural height. In addition, shielding electromagnetic radiation in at least one light emission direction, as may occur in the assembly 30 in FIGS. 3A to C by the control electrodes 52a to d, may be reduced.

FIG. 5 shows a schematic cross-sectional view of the device 30 in the sectional plane A.

The device 30 comprises the control electrodes 52a and 52b and 52c and 52d. The control electrodes 52b and 52c, exemplarily referred to as top gates, are arranged at a side of the insulation layer 38 facing away from the substrate 51. The control electrodes 52a and 52b are surrounded by the insulation layer 48 such that electrical contact is prevented between the control electrodes 52a and 52d and 52b and 52c and the electrodes 14a and 14b. The control electrodes 52a and 52d are arranged between the substrate 51 and the electrodes 14a and 14b. The control electrodes 52b and 52c are arranged such that the electrodes 14a and 14b are arranged between the substrate 51 and the control electrodes 52b and 52c.

In other words, a relatively simple setup with no multilayer system, high thermal and mechanical stability and energy efficiency due to small dimensions and good integratability is combined with the advantages of QD-LEDs. The device 40 may also be described to be an LED which combines the advantages of CNT-LEDs and the advantages of QD-LEDs.

Figure 6:
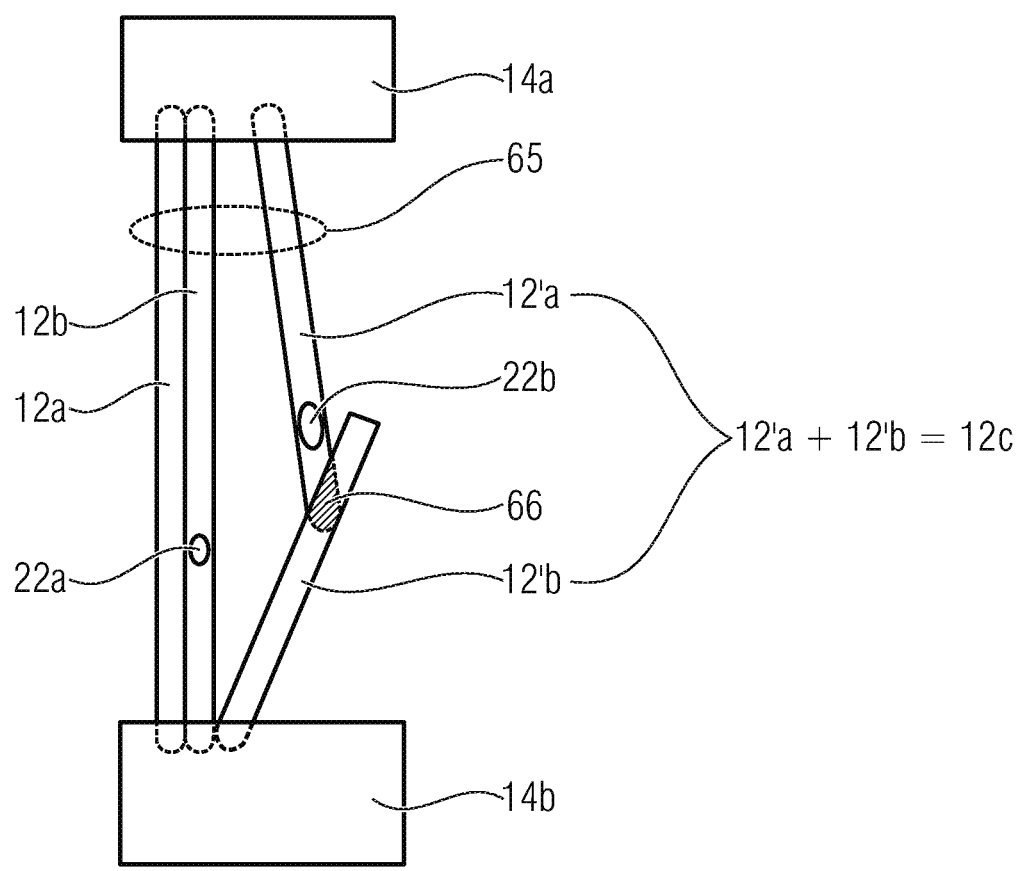
FIG. 6 is a schematic top view of a device comprising a bundle of nanostructures.

FIG. 6 shows a schematic top view of a device 60 comprising the first electrode 14a and the second electrode 14b which are connected via electrically conductive nanostructures 12a and 12b and 12c. The electrically conductive nanostructures 12a and 12b connect the electrodes 14a and 14b directly, i.e. in one portion. The electrically conductive nanostructure 12c comprises a first portion 12'a and a second portion 12'b. The electrically conductive nanostructure 12c may, for example, be a tube structure comprising a defect 66 (for illustration purposes illustrated in FIG. 6 as a break) at a position, wherein the defect forms the transition from the first portion 12'a to the second portion 12'b. Additionally, the device 60 comprises the radiation molecule 22a and the radiation molecule 22b. The radiation molecule 22a is arranged at the electrically conductive nanostructure 12b.

The portions 12'a and 12'b comprise an axial length which is smaller than a distance between the first electrode 14a and the second electrode 14b. The portions 12'a and 12'b are connected to each other at said defect position 66 such that the first electrode 14a and the second electrode 14b are connected via an electrical path which comprises the portions 12'a and 12'b.

In other words, the portions 12'a and 12'b of the electrically conductive nanostructure 12c may be referred to as segments contacted to each other. This means that a connection or an electrically conductive nanostructure between the electrodes 14a and 14b may be formed from two or more portions.

The electrically conductive nanostructures 12a, 12b and 12c form a bundle 65 of electrically conductive nanostructures. Embodiments include bundles 65 which comprise a small number, like less than 60, less than 75 or less than 80 electrically conductive nanostructures. Intermolecular interactions between the electrically conductive nanostructures which may impede the efficiency of the device may be reduced or avoided by a limited and small number of electrically conductive nanostructures.

A field-induced deposition of the electrically conductive nanostructures 12a to c in a manufacturing process, like dielectrophoresis (DEP), allows a parallel arrangement or basically parallel arrangement of the electrically conductive nanostructures 12a to c.

Figure 7:
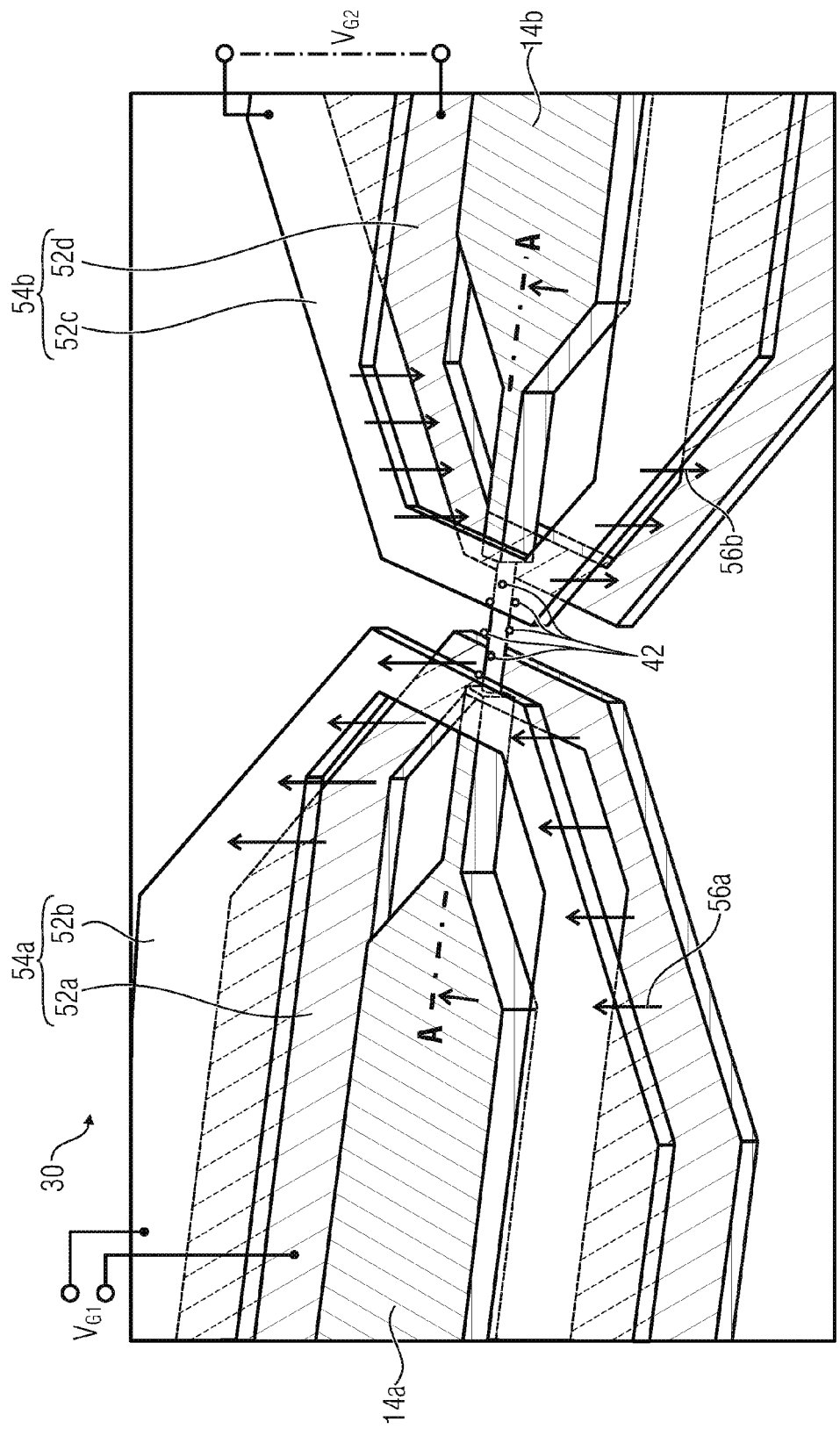
FIG. 7 is a perspective view of a device for emitting electromagnetic radiation based on light converter molecules.

FIG. 7 shows a perspective view of a device 70 for emitting electromagnetic radiation. The device 70 comprises the electrodes 14a and 14b, the control electrode means 54a having the control electrodes 52a and 52b, and the control electrode means 54b having the control electrodes 52c and 52d. The electrically conductive nanostructure 12 is configured to connect the electrodes 14a and 14b such that electrons and holes from the electrodes 14a and 14b may recombine while emitting electromagnetic radiation in the electrically conductive nanostructure 12. Light converter molecules 42 configured to receive the electromagnetic radiation of the electrically conductive nanostructure 12 and emit electromagnetic radiation in a different wavelength range based on electroluminescence, phosphorescence or florescence, are arranged at the circumferential surface of the electrically conductive nanostructure 12. The light converter molecules 42 may exhibit mutually different emission wavelength such that, based on a combination of the light converter molecules 42, an emission spectrum of the device 70 may be adjusted based on the different emission wavelengths of the electrically conductive nanostructure 12 and the light converter molecules 42.

Basically, the device 70 differs from the device 30 by the particles arranged for emitting electromagnetic radiation. Whereas radiation molecules 22 are arranged in the device 30 to allow electromagnetic radiation to be emitted based on a recombination of electrons and holes within the radiation molecules 22, when the device 30 is operated as a light emitter, the device 70 comprises the light converter molecules 42 configured to receive the electromagnetic radiation based on a recombination of electrons and holes within the electrically conductive nanostructure 12 and emit electromagnetic radiation in an altered wavelength range.

Although the device 30 is described such that radiation molecules 22 are arranged at the electrically conductive nanostructure 12 and the device 70 is described such that light converter molecules 42 are arranged at the electrically conductive nanostructure 12, devices which comprise control electrode means and a combination of radiation molecules and light converter molecules which are arranged at the electrically conductive nanostructure or, may be, also in the insulation layer are also conceivable. The respective radiation molecules and light converter molecules may emit or receive equal or different wavelength ranges in groups, wherein filters, for example, may also be realized.

Additionally, as has been discussed already, light converter molecules and radiation molecules may also emit a respective individual wavelength range of the electromagnetic radiation.

The device 70 may also be referred to as CNT-LED without QDs and exemplarily comprises 2n gate electrodes for n=2, 3, . . . . The respective device may be adapted specifically to a respective application by the gate structures. This refers to the layout and the device area connected thereto, may be bottom gates, side gates and/or top gates, and additionally to an intensity of the electric field applied. Two, three or four gate electrodes may be arranged, for example.

Figure 8A:
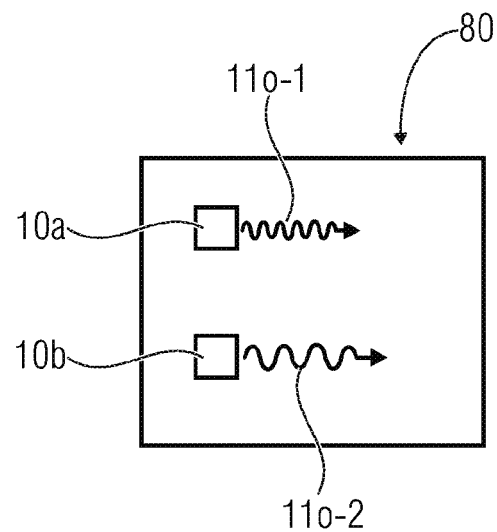
FIG. 8A is a schematic block circuit diagram of an assembly comprising two devices for emitting electromagnetic radiation.

FIG. 8A shows a schematic block circuit diagram of an assembly 80 comprising two devices 10a and 10b, as are described in FIG. 1. The assembly 80 may also be referred to as a light emission system.

The device 10a is configured to emit electromagnetic radiation 11o-1 of a first wavelength range. The device 10b is configured to emit electromagnetic radiation 11o-2 in a second wavelength range. The first wavelength range may differ from the second wavelength range. Exemplarily, the first wavelength range may be greater or smaller, i.e. comprise a greater or a smaller bandwidth, than the second wavelength range. The first wavelength range may also, completely or partly, comprise equal or different wavelengths compared to the second wavelength range.

The devices 10a and 10b may be controllable separately such that a varying overall wavelength of the electromagnetic radiation may be released over time. Thus, the device 80 may be a tunable light emission system, i.e. altering during operation, for example with regard to the wavelength emitted.

The device 80 may allow different wavelengths to be mixed for a common emitted light, i.e. electromagnetic radiation, by combining different wavelength ranges. White light may, for example, be provided by this. Alternatively, a brightness of the device 80 may be increased when, for example, the devices 10a and 10b emit an equal wavelength range.

Alternatively or additionally, the device 18 may comprise one or several devices 20, 30, 40 and/or 60. In addition, the device 80 may comprise further devices for light emission and/or photo detection. A device 70 may, for example, be arranged as a further device for emitting electromagnetic radiation or be used as a device 10 for photodetection.

Figure 8B:
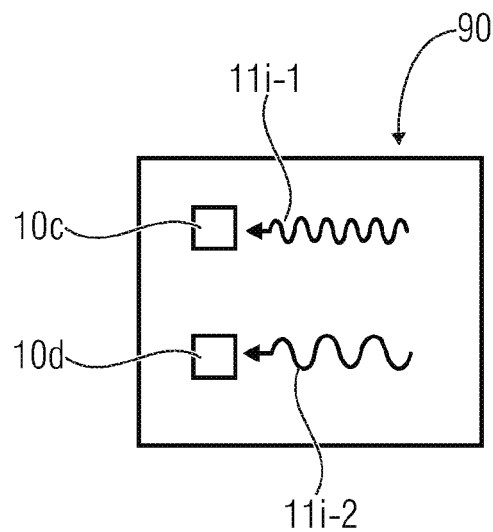
FIG. 8B is a schematic block circuit diagram of an assembly comprising two devices for receiving electromagnetic radiation.

FIG. 8B shows a schematic block circuit diagram of an assembly 90 comprising two devices 10c and 10d, as are described in FIG. 1. The assembly 90 may also be referred to as a light reception system, photo detection system, radiation reception system or radiation detection system.

The device 10*c* is configured to receive electromagnetic radiation 11*i*-1 at a first wavelength range. The device 10*d* is configured to receive electromagnetic radiation 11*i*-2 in a second wavelength range. The first wavelength range may differ from the second wavelength range. Exemplarily, the first wavelength range may be greater or smaller, i.e. comprise greater or smaller a bandwidth, than the second wavelength range. The first wavelength range may additionally, completely or partly, comprise equal or different wavelengths compared to the second wavelength range.

The devices 10*c* and 10*d* may be controllable separately or the output signal thereof be evaluated separately. Thus, the assembly 90 may be a tunable light detection system or a light detection system which evaluates incident light (incident radiation) independently in at least two wavelength ranges. In this way, the spectral composition of the incident light may, for example, be analyzed. A potential application of the assembly 90 may be a spectrometer.

In alternative embodiments, the devices 10*c* and 10*d* may be elements of an array or matrix assembly of several devices of the same kind in order to form an image sensor, for example. The devices 10*c* and 10*d* may in this case essentially be configured for the same wavelength range or also for different wavelength ranges of incident light (for example red, green, blue).

Figure 8C:
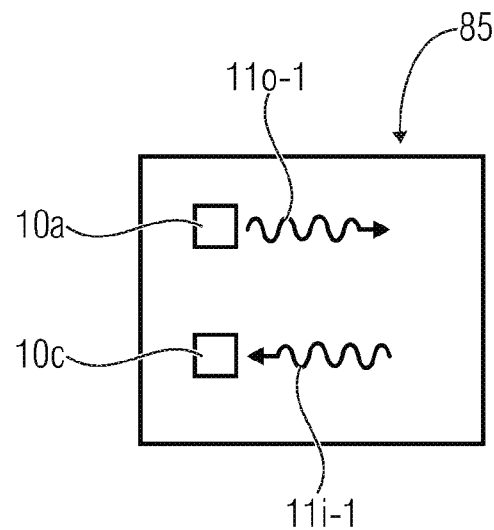
FIG. 8C is a schematic block circuit diagram of an assembly comprising two devices of which one is provided for emitting and the other for receiving electromagnetic radiation.

FIG. 8C shows a schematic block circuit diagram of an assembly 85 comprising two devices 10*a* and 10*c*, as are described in FIG. 1. The device 10*a* is designed as a radiation-emitting device for electromagnetic radiation in the wavelength range 11*o*-1. The device 10C is designed as a radiation-receiving device for electromagnetic radiation in the wavelength range 11*i*-1. The wavelength ranges 11*o*-1 and 11*i*-1 may basically be identical or alternatively differ from each other. A potential application of the assembly 85 is a so-called optical interconnect consisting of a device 10*a* for emitting and a device 10*c* for receiving electromagnetic radiation.

FIG. 9 shows a schematic illustration of a band structure 82 of an electrically conductive nanostructure, like a CNT, and a band structure 84 of a radiation molecule, like a semi-conducting quantum dot. The band structure 82 describes a course of the energy level within the electrically conductive nanostructure. The holes 18*a*-*h* and the electrons 16*a*-*h* comprise mutually different transport directions. When, for example, the electron 16*b* impinges on the hole 18*h*, the electromagnetic radiation 44 may be emitted when the electron 16*b* recombines with the hole 18*h*. An electric field, which acts on the electrons 16*a*-*h* and/or the holes 18*a*-*h* based on the control electrodes 52*a* and/or 52*c* may alter the energy level of the electrons 16*a*-*h* and/or the holes 18*a*-*h* such that the tunneling probability into the radiation molecule, which has the bandgap 84, increases, for example. A recombination, as is, for example, illustrated for the electron 16*a* and the hole 18*g*, may take place while emitting electromagnetic radiation 11*o*. In other words, in the case of a recombination, an electron of a higher energy level drops back to a hole of a lower energy level. The energy released may be emitted as light.

The electromagnetic radiation 11*o* may comprise a larger energy compared to the electromagnetic radiation 44. This is illustrated exemplarily by an energy different arrow 86*b* which illustrates the recombination of the electron 16*a* and the hole 18*g* within a radiation molecule, which is larger compared to an energy different arrow 86*a* which illustrates recombination of the electron 16*b* with the hole 18*h*. The length of the energy different arrows 86*a* and 86*b* illustrates the bandgap within the nanostructure or radiation molecule which in turn determines the wavelength of the light emitted or absorbed. An increased field voltage to the electrodes 52*a* and 52*c*, i.e. an increased number of field lines which cross the electrically conductive nanostructure may increase an extent of the tunneling process, i.e. a number of tunneling electrons 16*a* and holes 18*a* and, thus, a brightness of the radiation 11*o* emitted, for example.

The higher the energy difference between electrons 16*a*-*h* and holes 18*a*-*h*, the more efficient may the tunneling process be performed.

In other words, an increased field strength may result in brighter light emitted. The tunneling process may also be influenced when operating the device as a photodetector.

Figure 10:
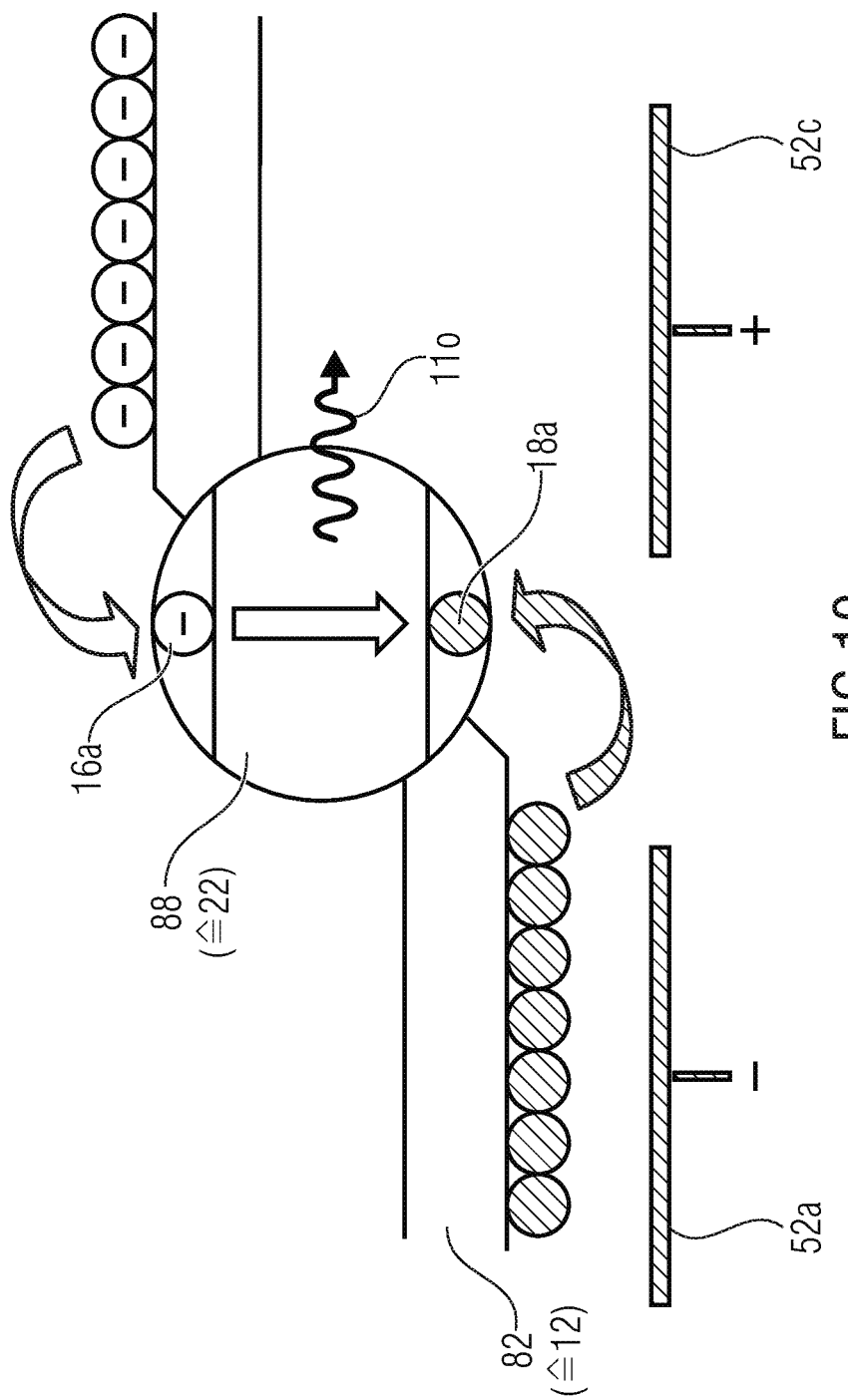
FIG. 10 shows an alternative schematic band model for the flow of energy within the electrically conductive nanostructure and a radiation molecule.

FIG. 10 shows a schematic band model for the course of energy within the electrically conductive nanostructure. The circuit arranged in the center relates to an electron 16*a* and a free hole 18*a* having tunneled into a radiation molecule with a band structure 88. The band structure comprises a greater bandgap than the band structure 82, i.e. a larger amount of energy is released in the case of recombination. This is illustrated by the band distance in the band structure 88 which is increased compared to the band structure 82. Recombination of the electron 16*a* with the free hole 18*a* may result in electromagnetic radiation 11*o* to be emitted. Of course, radiation molecules the bandgap 88 of which is smaller than that of the electrically conductive nanostructure 82 are also conceivable.

Figure 11:
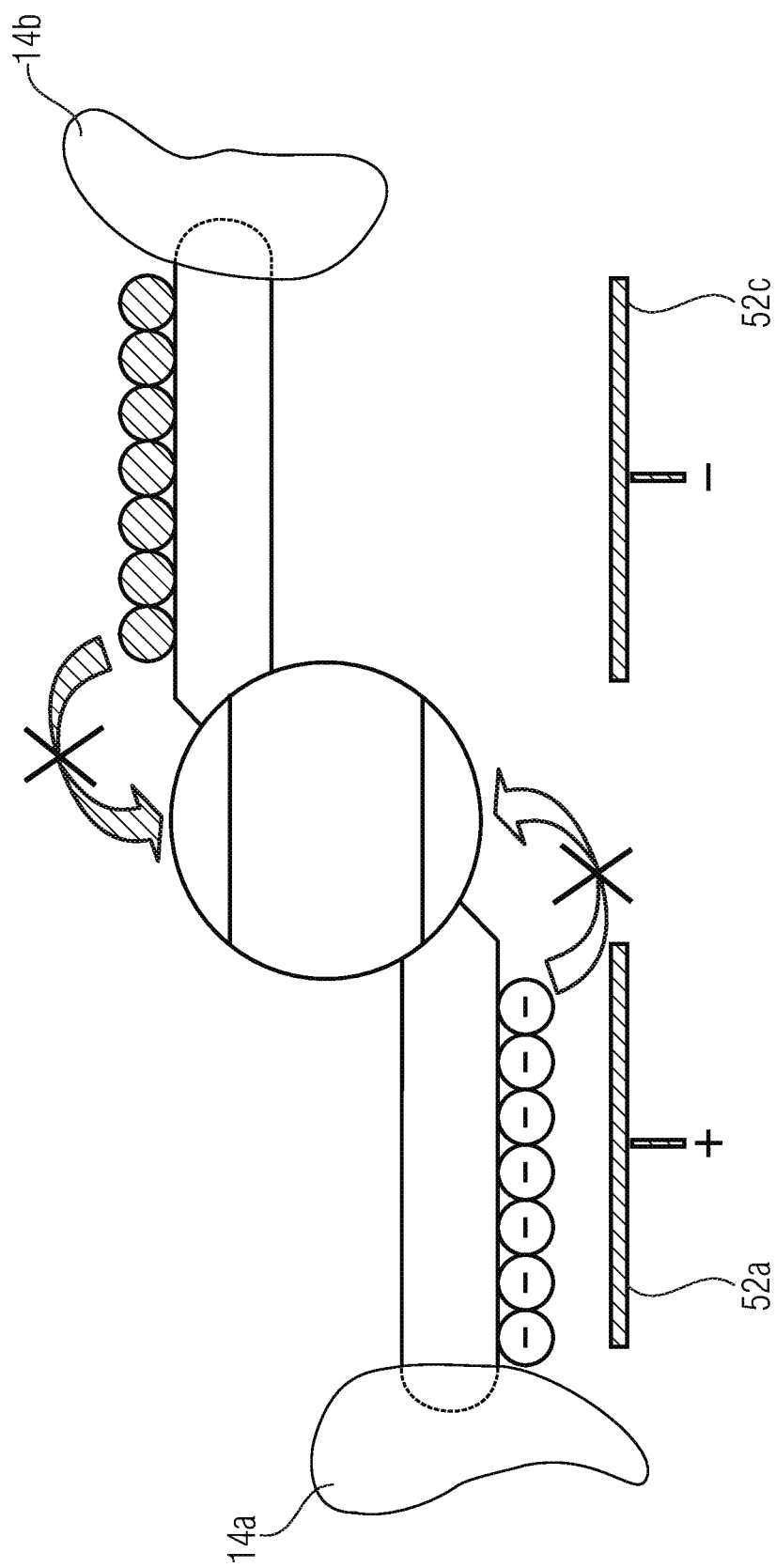
FIG. 11 shows the schematic assembly of FIG. 10 in which polarity at the control electrodes is reversed.

FIG. 11 shows the schematic assembly of FIG. 10 in which polarity at the controlled electrodes 52*a* and 52*c* is reversed. Based thereon, the introduction of electrons, as are illustrated by white circles and holes, illustrated by black circles, is reversed also. Based on the electric fields generated by the control electrodes 52*a* and 52*c*, energy levels of electrons and holes may be reduced compared to the illustration in FIG. 10 such that a tunneling process of electrons and holes into the radiation molecule, as is illustrated by the circle arranged in the center, is reduced or even prevented. In other words, FIG. 11 describes operation of a device, like the device 30 or 40, in a reverse direction, i.e. a reduced amount of electromagnetic radiation 11*o* is emitted, wherein the amount may be reduced to zero.

Although some aspects have been described in connection with a device, it is to be understood that these aspects also represent a description of the corresponding method such that a block or element of a device is to be understood to be also a corresponding method step or as a feature of a method step. In analogy, aspects having been described in connection with or as a method step also represent a description of a corresponding block or detail or a feature of a corresponding device.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A device for emitting or detecting electromagnetic radiation, comprising:
   a first electrode and a second electrode;
   at least one electrically conductive nanostructure which connects the first electrode and the second electrode to each other and is configured to transport electrons and holes from the first and the second electrode or to the first and the second electrode; and at least one nanoscopic material structure arranged at a circumferential surface of the electrically conductive nanostructure, configured to absorb electrons and holes and emit the electromagnetic radiation with recombination of electrons absorbed and holes absorbed or to absorb electromagnetic radiation and emit electrons and holes based on the electromagnetic radiation absorbed; wherein an end of the electrically conductive nanostructure arranged at the first or the second electrode is surrounded at least partly by the first or second electrode along a region of the circumferential surface in order to provide electrical contact between the first or second electrode and the electrically conductive nanostructure, a control electrode element arranged to be adjacent to the electrically conductive nanostructure and configured to influence, when applying an electric voltage to the control electrode element by means of an electric field generated, an energy level of holes or electrons in the electrically conductive nanostructure; and wherein the device is implemented such that at least one of:

the control electrode element is adjacent to the first electrode and additionally comprises at least another control electrode element arranged to be adjacent to the second electrode and configured to influence, when applying an electric voltage to the further control electrode element by means of an electric field generated, an energy level of holes or electrons in the electrically conductive nanostructure;

the control electrode element is arranged between a substrate and the first electrode;

the first electrode is arranged between the control electrode element and a substrate; and the control electrode element is arranged offset in a lateral direction perpendicularly to a connective axis between the first electrode and the second electrode; and wherein the device further comprises an electroluminescent or phosphorescent or fluorescent light converter molecule arranged at a circumferential surface of the electrically conductive nanostructure and configured to receive at least partly the electromagnetic radiation at the first wavelength and emit electromagnetic radiation at a second wavelength based on a fluorescence or phosphorescence.

2. The device in accordance with claim 1, wherein the nanoscopic material structure is a colloidal or elongated quantum dot.

3. The device in accordance with claim 1, wherein the nanoscopic material structure is arranged at the electrically conductive nanostructure by means of covalent bonding.

4. The device in accordance with claim 1, wherein the nanoscopic material structure is arranged at the electrically conductive nanostructure by means of non-covalent bonding.

5. The device in accordance with claim 1, wherein the electrically conductive nanostructure is arranged in an angle of smaller than or equaling 20° relative to a surface plane of the device.

6. The device in accordance with claim 1, wherein the nanoscopic material structure is configured to emit electromagnetic radiation at a wavelength, wherein said wavelength comprises a wavelength range between $1*10(\exp-7)$ m and $1*10(\exp-5)$ m.

7. The device in accordance with claim 1, wherein the at least one nanoscopic material structure is one of a plurality of nanoscopic material structures of the device, the plurality of nanoscopic material structures configured to emit electromagnetic radiation at least two wavelength ranges.

8. The device in accordance with claim 1, further comprising an insulation material at a surface of the device facing away from a substrate.

9. The device in accordance with claim 1, wherein the first and second electrodes are directly connected to each other by means of the nanostructure by a first end of the nanostructure being arranged directly at the first electrode and a second end of the nanostructure being arranged directly at the second electrode.

10. A method for providing a device for emitting or receiving electromagnetic radiation, comprising:

arranging a first and a second electrode;

connecting the first electrode and the second electrode to at least one electrically conductive nanostructure for transporting electrons and holes from the first and the second electrode or to the first and the second electrode such that an end of the electrically conductive nanostructure arranged at the first or the second electrode is surrounded at least partly by the first or second electrode along a region of the circumferential surface in order to provide electrical contact between the first or second electrode and the electrically conductive nanostructure;

arranging at least one nanoscopic material structure at a circumferential surface of the electrically conductive nanostructure for absorbing electrons and holes for emitting the electromagnetic radiation with recombination of electrons absorbed and holes absorbed or for absorbing electromagnetic radiation and emitting electrons and holes based on the electromagnetic radiation absorbed; and arranging a control electrode element arranged to be adjacent to the electrically conductive nanostructure such that, when applying an electric voltage to the control electrode element by means of an electric field generated, an energy level of holes or electrons in the electrically conductive nanostructure may be influenced; and implementing the device such that at least one of:

the control electrode element is adjacent to the first electrode and additionally comprises at least another control electrode element arranged to be adjacent to the second electrode and configured to influence, when applying an electric voltage to the further control electrode element by means of an electric field generated, an energy level of holes or electrons in the electrically conductive nanostructure;

the control electrode element is arranged between a substrate and the first electrode;

the first electrode is arranged between the control electrode element and a substrate;

the control electrode element is arranged offset in a lateral direction perpendicularly to a connective axis between the first electrode and the second electrode;

the device further comprises an electroluminescent or phosphorescent or fluorescent light converter molecule arranged at a circumferential surface of the electrically conductive nanostructure and configured to receive at least partly the electromagnetic radiation at the first wavelength and emit electromagnetic radiation at a second wavelength based on a fluorescence or phosphorescence.

* * * * *